US012566234B2

(12) United States Patent
Wang et al.

(10) Patent No.: US 12,566,234 B2
(45) Date of Patent: Mar. 3, 2026

(54) POSITIONING SIGNAL SENDING METHOD AND APPARATUS

(71) Applicant: HUAWEI TECHNOLOGIES CO., LTD., Guangdong (CN)

(72) Inventors: Bichai Wang, Beijing (CN); Xueru Li, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 106 days.

(21) Appl. No.: 18/604,445

(22) Filed: Mar. 13, 2024

(65) Prior Publication Data

US 2024/0302474 A1     Sep. 12, 2024

Related U.S. Application Data

(63) Continuation of application No. PCT/CN2022/114032, filed on Aug. 22, 2022.

(30) Foreign Application Priority Data

Sep. 18, 2021    (CN) .......................... 202111100880.6
Nov. 19, 2021    (CN) ........................ 202111376564.1

(51) Int. Cl.
*G01S 1/04*          (2006.01)
*H03K 5/04*          (2006.01)

(52) U.S. Cl.
CPC .............. *G01S 1/0428* (2019.08); *H03K 5/04* (2013.01)

(58) Field of Classification Search
CPC ...... G01S 1/0428; H03K 5/04; H04B 1/7172; H04B 1/7174; H04W 16/28; H04W 64/00
See application file for complete search history.

(56) References Cited

U.S. PATENT DOCUMENTS

| | | | |
|---|---|---|---|
| 2015/0054526 A1 | 2/2015 | Kim | |
| 2021/0286045 A1* | 9/2021 | Bayesteh | H04B 7/0695 |
| 2021/0400595 A1* | 12/2021 | Sutskover | H04W 52/226 |

FOREIGN PATENT DOCUMENTS

| | | |
|---|---|---|
| CN | 110031860 B | 4/2021 |
| JP | 2020159980 A | 10/2020 |

OTHER PUBLICATIONS

IEEE Std 802.15.4 2020, IEEE Standard for Low-Rate Wireless Networks IEEE Computer Society, LAN/MAN Standards Committee, May 6, 2020, total 800 pages.
IEEE Std 802.15.4z 2020, IEEE Standard for Low-Rate Wireless Networks Amendment 1: Enhanced Ultra Wideband (UWB) Physical Layers (PHYs) and Associated Ranging Techniques IEEE Computer Society, LAN/MAN Standards Committee, Jun. 4, 2020, total 174 pages.

* cited by examiner

*Primary Examiner* — David B Lugo

(57) ABSTRACT

A positioning signal sending method and apparatus are provided. A first signal is generated, where duration of a first rising edge of the first signal is less than duration of a first falling edge, the duration of the first rising edge is duration of a rising edge of a main lobe waveform of the first signal, and the duration of the first falling edge is duration of a falling edge of the main lobe waveform of the first signal; and the first signal is sent. In embodiments of this application, rising time of a main lobe waveform of a signal generated is short, and shorter rising time of the main lobe waveform is more conducive to distinguishing two adjacent paths or identifying a first arrival path of a received signal.

20 Claims, 14 Drawing Sheets

Sending device

Receiving device

S701: Generate a first signal, where duration of a rising edge of a main lobe waveform of the first signal is less than duration of a falling edge S702: First signal 1     1     0     1     0

$T$ t

Transmission
waveform t

First arrival path

Receiving
waveform $\tau$ t

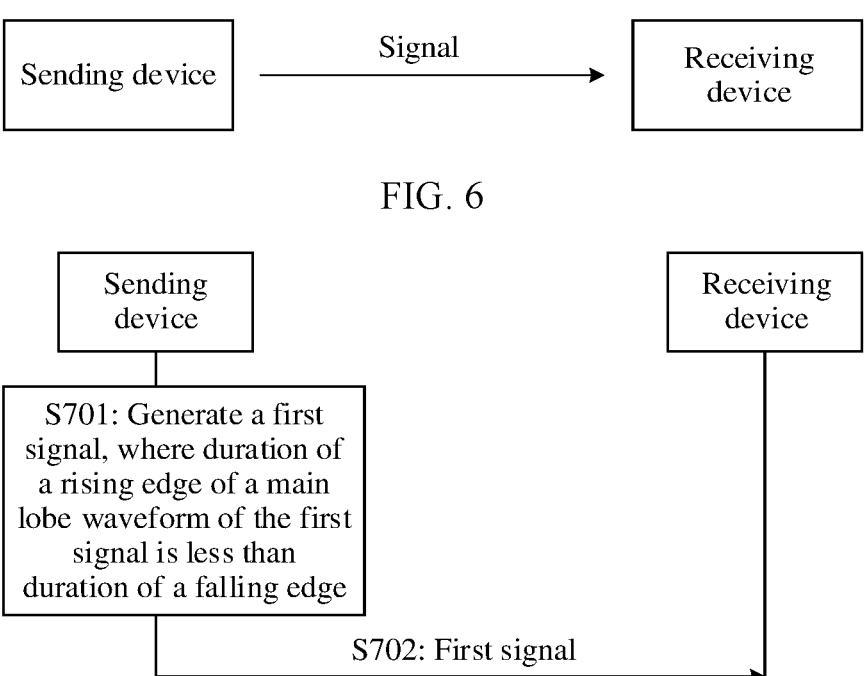
FIG. 6
FIG. 7
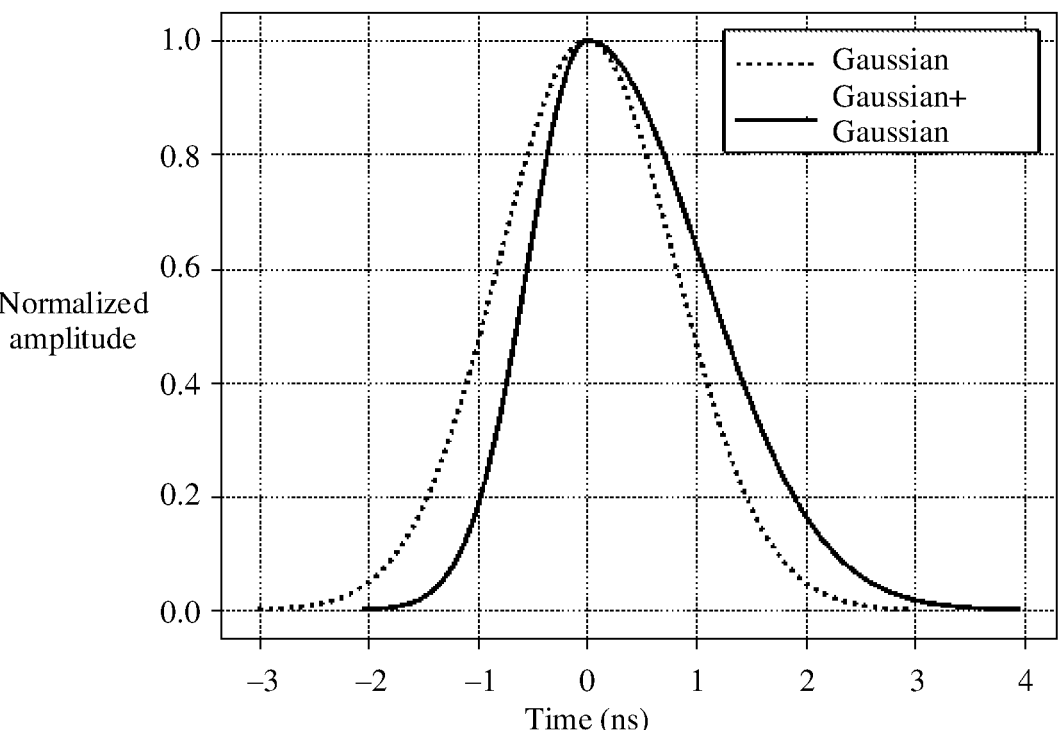
FIG. 8

POSITIONING SIGNAL SENDING METHOD AND APPARATUS

CROSS-REFERENCE TO RELATED APPLICATIONS

This is a continuation of International Application No. PCT/CN2022/114032, filed on Aug. 22, 2022, which claims priority to Chinese Patent Application No. 202111100880.6, filed on Sep. 18, 2021 and Chinese Patent Application No. 202111376564.1, filed on Nov. 19, 2021. All of the afore-mentioned applications are hereby incorporated by reference in their entireties.

TECHNICAL FIELD

This application relates to the field of communication technologies, and in particular, to a positioning signal sending method and apparatus.

BACKGROUND

An impulse-radio ultra-wideband (IR-UWB) technology can implement centimeter-level positioning precision with low power consumption by sending short pulses of nano-second (ns) magnitude. A common ranging method of UWB is that a receiving device calculates a distance between the receiving device and a sending device by measuring a first arrival path of a received signal. Therefore, the receiving device needs to distinguish a plurality of paths of the received signal, to determine the first arrival path. A capa-bility of UWB to distinguish between a plurality of paths is related to a width of a main lobe of a transmitted pulse. A narrower main lobe is more conducive to distinguishing between two adjacent paths.

In the conventional UWB protocol, no specific transmit-ted pulse is specified, and only a constraint that a cross-correlation between an actual transmitted pulse and a root raised cosine (RRC) pulse response needs to meet a specific condition is imposed. A common waveform in the conven-tional technology is a main lobe symmetric waveform in time domain, for example, an RRC pulse or a Gaussian pulse. In a first-arrival-path ranging mechanism based on a received signal, it is difficult to distinguish between a plurality of paths with short delay intervals by using a conventional waveform of a transmitted pulse, and conse-quently ranging precision is limited.

SUMMARY

Embodiments of this application provide a positioning signal sending method and apparatus, to improve ranging/positioning precision.

According to a first aspect, a positioning signal sending method is provided. The method may be performed by a sending device, or may be performed by a larger device including the sending device, or may be performed by a chip system or another functional module. The chip system or the functional module can implement a function of the sending device. The chip system or the functional module is, for example, disposed in the sending device. The sending device is, for example, a network device (for example, an access network device or a core network device) or a terminal device. For example, the sending device is a device that supports a UWB technology. The method includes: gener-ating a first signal, where duration of a first rising edge of the first signal is less than duration of a first falling edge, the duration of the first rising edge is duration of a rising edge of a main lobe waveform of the first signal, and the duration of the first falling edge is duration of a falling edge of the main lobe waveform of the first signal; and sending the first signal.

In embodiments of this application, the duration of the first rising edge of the first signal is less than the duration of the first falling edge. In other words, rising time of a main lobe waveform of a signal generated in embodiments of this application is short, and shorter rising time of the main lobe waveform is more conducive to distinguishing between two adjacent paths, or is more conducive to identifying a first arrival path of a received signal. Therefore, ranging is performed by using the first signal provided in embodiments of this application, so that a receiving device can distinguish between a plurality of paths with short delay intervals, or a receiving device can more accurately determine arrival time of a first arrival path of a signal. This can improve ranging and/or positioning precision.

In an optional implementation, the first rising edge is determined based on a rising edge of a main lobe waveform of a second signal, the first falling edge is determined based on a falling edge of a main lobe waveform of a third signal, and the main lobe waveform of the second signal and the main lobe waveform of the third signal are different. A first waveform is an asymmetric waveform in time domain. In this case, a manner in which the sending device generates the first signal is as follows: The sending device may generate the second signal and the third signal, where both a time domain waveform of a main lobe of the second signal (which is referred to as a second waveform) and a time domain waveform of a main lobe of the third signal (which is referred to as a third waveform) are asymmetric wave-forms in time domain, to obtain the first signal based on the second signal and the third signal. For example, the first waveform may be obtained by splicing the second waveform and the third waveform. It is simple to generate the first signal in this manner.

In an optional implementation, that the main lobe wave-form of the second signal and the main lobe waveform of the third signal are different includes: Pulse duration of the main lobe waveform of the second signal and pulse duration of the main lobe waveform of the third signal are different. Main lobe waveforms of two signals are different includes, for example, that amplitudes of the two main lobe waveforms are different, and/or duration of the two main lobe wave-forms is different. In embodiments of this application, the duration of the two main lobe waveforms may be different, so that the asymmetric first waveform can be obtained by splicing.

In an optional implementation, both the second signal and the third signal are Gaussian pulse signals; both the second signal and the third signal are RRC pulse signals; both the second signal and the third signal are triangular pulse signals; the second signal is a Gaussian pulse signal, and the third signal is an RRC pulse signal; the second signal is an RRC pulse signal, and the third signal is a Gaussian pulse signal; the second signal is a Gaussian pulse signal, and the third signal is a triangular pulse signal; the second signal is a triangular pulse signal, and the third signal is a Gaussian pulse signal; the second signal is a triangular pulse signal, and the third signal is an RRC pulse signal; or the second signal is an RRC pulse signal, and the third signal is a triangular pulse signal. It can be learned that the second signal and the third signal may be implemented in a plurality of manners. This is flexible. For example, if both the second signal and the third signal are Gaussian pulse signals, spectral efficiency of the obtained first signal is almost the same as spectral efficiency of a conventional Gaussian pulse signal. This is equivalent to that spectral efficiency can be ensured in embodiments of this application while ranging precision is improved. For another example, if the second signal is a Gaussian pulse signal, and the third signal is an RRC pulse signal, spectral efficiency of the obtained first signal is high compared with spectral efficiency of a conventional Gaussian pulse signal. This is equivalent to that, in embodiments of this application, both ranging precision and spectral efficiency can be improved. For another example, both the second signal and the third signal are triangular pulse signals. This is conducive to better distinguish between a plurality of paths.

In an optional implementation, a ratio of the duration of the first rising edge to the duration of the first falling edge is greater than or equal to a first threshold, and the first threshold is determined based on a power spectrum density constraint condition. If the ratio of the duration of the first rising edge to the duration of the first falling edge is greater than or equal to the first threshold, the first signal can meet the power spectrum density constraint condition and comply with conventional protocol specifications.

In an optional implementation, both the second signal and the third signal are Gaussian pulse signals, and the first threshold is ½; the second signal is a Gaussian pulse signal, the third signal is an RRC pulse signal, and the first threshold is ⅔; the second signal is a Gaussian pulse signal, the third signal is a triangular pulse signal, and the first threshold is $5/12$; the second signal is a triangular pulse signal, the third signal is a Gaussian pulse signal, and the first threshold is $5/9$; the second signal is a triangular pulse signal, the third signal is an RRC pulse signal, and the first threshold is $5/7$; or both the second signal and the third signal are triangular pulse signals, and the first threshold is ½. When implementations of the second signal and/or the third signal are/is different, the first threshold may be different, and a specific first threshold may be determined based on the power spectrum density constraint condition.

In an optional implementation, before the sending the first signal, the method further includes: sending first indication information, where the first indication information includes (or indicates) one or more of the following: shape information of the first signal; shape information of the second signal and shape information of the third signal; the duration of the first rising edge; the duration of the first falling edge; or a timestamp of the first signal. The receiving device may determine the distance between the receiving device and a sending device based on a difference between a timestamp of the received signal and the timestamp of the first signal indicated by the first indication information. The timestamp of the first signal is a moment at which a first sampling point on the first signal is sent, and the timestamp of the received signal is a moment at which the first sampling point on the first signal is received. For example, the first signal may include a plurality of sampling points, and the first sampling point may be a sampling point corresponding to a peak amplitude of the first signal, or a sampling point corresponding to a start location or an end location of the first rising edge, or a sampling point corresponding to a start location or an end location of the first falling edge, or may be any sampling point of the first signal. The timestamp of the first signal may be predefined, or may be indicated by the sending device to the receiving device by using the first indication information. The timestamp of the received signal may be determined based on the first indication information. For example, after detecting a location of a peak amplitude of the first arrival path of the received signal, the receiving device may determine the timestamp of the received signal based on a parameter (for example, one or more of parameters such as the shape information of the first signal, the shape information of the second signal, the shape information of the third signal, the duration of the first rising edge, or the duration of the first falling edge) indicated by the first indication information.

According to a second aspect, a positioning signal sending apparatus is provided. The apparatus may be the sending device according to the first aspect. The apparatus has a function of the foregoing sending device. The apparatus is, for example, a sending device, or a functional module in a sending device, for example, a baseband apparatus or a chip system.

In an optional implementation, the apparatus includes a baseband apparatus and a radio frequency apparatus. The baseband apparatus may implement functions such as signal generation, and the radio frequency apparatus may implement functions such as signal-sending and/or receiving.

In another optional implementation, the apparatus includes a processing unit (also referred to as a processing module sometimes) and a transceiver unit (also referred to as a transceiver module sometimes). For example, the processing unit may implement a function of the baseband apparatus, and the transceiver unit may implement a function of the radio frequency apparatus. When the transceiver unit implements the sending function, the transceiver unit may be referred to as a sending unit (also referred to as a sending module sometimes). When the transceiver unit implements the receiving function, the transceiver unit may be referred to as a receiving unit (also referred to as a receiving module sometimes). The sending unit and the receiving unit may be a same functional module, and the functional module is referred to as a transceiver unit. The functional module can implement the sending function and the receiving function. Alternatively, the sending unit and the receiving unit may be different functional modules, and the transceiver unit is a general term for these functional modules.

In yet another optional implementation, the apparatus further includes a storage unit. The processing unit is configured to: be coupled to the storage unit, and execute a program or instructions in the storage unit, to enable the apparatus to perform a function of the sending device in the first aspect.

According to a third aspect, a computer-readable storage medium is provided, where the computer-readable storage medium is configured to store a computer program or instructions, and when the computer program or instructions is or are run, the method performed by the sending device in the first aspect is implemented.

According to a fourth aspect, a computer program product including instructions is provided. When the computer program product runs on a computer, the method according to the first aspect is implemented.

BRIEF DESCRIPTION OF DRAWINGS

FIG. 6 is a schematic diagram of an application scenario according to an embodiment of this application;

FIG. 7 is a flowchart of a positioning signal sending method according to an embodiment of this application;

FIG. 8 is a schematic diagram of a first waveform according to an embodiment of this application;

DESCRIPTION OF EMBODIMENTS

Figure 1:
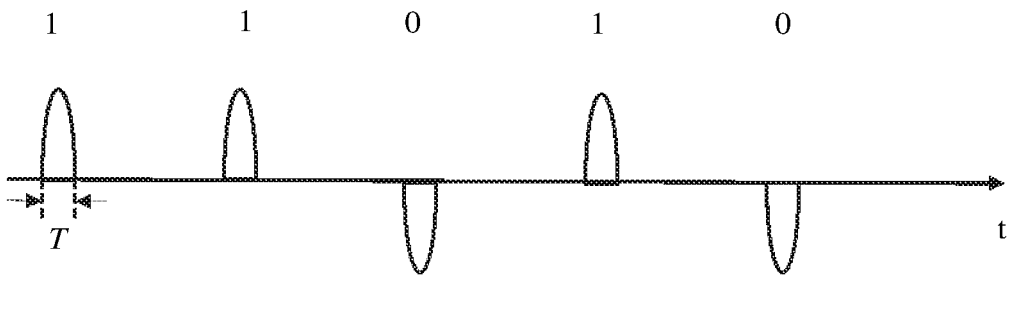
FIG. 1 is a schematic diagram of a pulse sequence sent by a sending device.

To make objectives, technical solution, and advantages of embodiments of this application clearer, the following further describes embodiments of this application in detail with reference to the accompanying drawings.

The following describes some terms or concepts in embodiments of this application, to facilitate understanding by a person skilled in the art.

In embodiments of this application, a communication apparatus is, for example, a terminal device, or a functional module (for example, a chip system or a communication chip) disposed in the terminal device, or may be a part or a component having a function of the terminal device, or may be a large device including the terminal device. The terminal device is a device having a wireless transceiver function, and may be a fixed device, a mobile device, a handheld device (for example, a mobile phone), a wearable device, a vehicle-mounted device, a road side unit (RSU), or a wireless apparatus (for example, a communication module, a modem, or a circuit system) built in the foregoing device. For example, the terminal device includes but is not limited to a terminal device in the following scenarios: cellular communication, device-to-device (D2D) communication, vehicle to everything (V2X), machine-to-machine/machine-type communication (M2M/MTC), internet of things (IoT), virtual reality (VR), augmented reality (AR), industrial control, self driving, remote medical, a smart grid, smart furniture, smart office, smart wearables, smart transportation, a smart city, an uncrewed aerial vehicle, a robot, and the like. The terminal device may be sometimes referred to as user equipment (UE), a terminal, an access station, a UE station, a remote station, a wireless communication device, a user apparatus, or the like. For ease of description, an example in which the communication apparatus is UE is used for description in embodiments of this application.

In embodiments of this application, the communication apparatus may alternatively be a network device, for example, include an access network device and/or a core network device. The access network device is a device having a wireless transceiver function, and is configured to communicate with the terminal device. The access network device includes but is not limited to a base transceiver station (BTS), a NodeB (NodeB), an evolved NodeB (eNodeB/eNB, or gNodeB/gNB), or a transmission reception point (TRP) in the foregoing communication system, a base station subsequently evolved from a 3rd generation partnership project (3GPP), an access node in a wireless fidelity (Wi-Fi) system, a wireless relay node, a wireless backhaul node, or the like. The base station may be a macro base station, a micro base station, a pico base station, a small cell, a relay station, or the like. A plurality of base stations may support networks of a same access technology mentioned above, or may support networks of different access technologies mentioned above. The base station may include one or more co-site or non-co-site transmission receiving points. Alternatively, the network device may be a radio controller, a central unit (CU), and/or a distributed unit (DU) in a cloud radio access network (CRAN) scenario. Alternatively, the network device may be a server, a wearable device, a vehicle-mounted device, an RSU, or the like. The following uses an example in which the access network device is a base station for description. A plurality of network devices in the communication system may be base stations of a same type, or may be base stations of different types. The base station may communicate with the terminal device, or may communicate with the terminal device through a relay station. The terminal device may communicate with a plurality of base stations in different access technologies. The core network device is configured to implement functions such as mobility management, data processing, session management, and policy and charging. Names of devices that implement core network functions in systems of different access technologies may be different. This is not limited in embodiments of this application. A 5G system is used as an example, and the core network device includes: an access and mobility management function (AMF), a session management function (SMF), a user plane function (UPF), and the like.

In embodiments of this application, a communication apparatus for implementing a network device function may be a network device, or may be an apparatus that can support a network device in implementing the function, for example, a chip system. The apparatus may be installed in the network device. In the technical solutions provided in embodiments of this application, the technical solutions provided in embodiments of this application are described by using an example in which the apparatus configured to implement the function of the network device is the network device.

In embodiments of this application, unless otherwise specified, a quantity of nouns represents "a singular noun or a plural noun", that is, "one or more". "At least one" means one or more, and "a plurality of" means two or more. The term and/or describes an association relationship for describing associated objects and represents that three relationships may exist. For example, A and/or B may represent the following cases: Only A exists, both A and B exist, and only B exists, where A and B may be singular or plural. The character "/" generally indicates an "or" relationship between the associated objects. For example, A/B indicates A or B. At least one of the following items (pieces) or a similar expression thereof refers to any combination of these items, including any combination of singular items (pieces) or plural items (pieces). For example, at least one of a, b, or c indicates a, b, c, a and b, a and c, b and c, or a, b, and c, where a, b, and c may be singular or plural.

Ordinal numerals such as "first" and "second" mentioned in embodiments of this application are used to distinguish between a plurality of objects, and are not intended to limit sizes, content, a sequence, a time sequence, priorities, importance degrees, or the like of the plurality of objects. For example, a first signal and a second signal may be a same signal, or may be different signals. In addition, this name does not indicate that the two signals have different information amounts, content, priorities, importance, or the like. In addition, step numbers in embodiments described in this application are merely used to distinguish between different steps, but are not used to limit a sequence of the steps. For example, step S701 may be performed before step S702, or may be performed after step S702, or may be performed at the same time with step S702.

An IR-UWB technology can implement centimeter-level positioning precision with low power consumption by sending short pulses of nanosecond magnitude. According to a requirement of a UWB regulation, when a UWB device sends a signal, power of the signal may be different at different frequencies. At a frequency with a difference of −10 dB from peak power, a bandwidth of the signal is at least 500 MHZ, and an upper limit value of an equivalent isotropically radiated power spectral density (PSD) is −41 dBm/MHz. When the bandwidth at −10 dB is fixed, a higher spectrum utilization rate indicates a higher allowed transmit power.

In an IR-UWB wireless communication system, a sending device may add information that needs to be transmitted to a pulse for sending. For example, for a pulse p(t) whose duration is T, in a modulation mode based on binary phase shift keying (BPSK), if an information bit is 1, p(t) may be sent; and if an information bit is 0, −p(t) may be sent. A receiving device may determine an information bit by detecting whether an amplitude of a receiving waveform is 1 or −1. It is assumed that an information bit stream that needs to be transmitted by the sending device is 11010, and therefore a sent pulse sequence is shown in FIG. 1.

Figure 2:
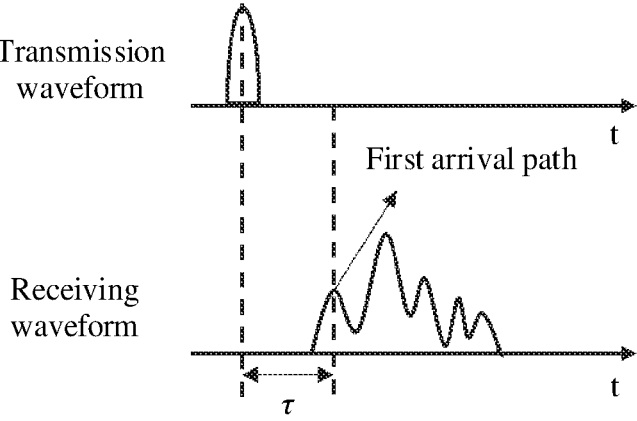
FIG. 2 is a schematic diagram of a first arrival path of a received signal.

In addition to information transfer, the IR-UWB wireless system may also perform positioning, that is, measuring a distance between the sending device and the receiving device. A common ranging method is that the receiving device calculates the distance between the sending device and the receiving device by measuring a first arrival path of a received signal. As shown in FIG. 2, in the figure, an upper half part is a pulse in a pulse sequence sent by the sending device, and a lower half part is a receiving waveform obtained after the pulse passes through a plurality of paths. If a time difference between time of sending the pulse by the sending device and time of a first arrival path of the receiving waveform is $\tau$, the distance between the sending device and the receiving device is d=$\tau$×c, where c represents the speed of light. A capability of UWB to distinguish between a plurality of paths is related to a width of a main lobe of a transmitted pulse in time domain. A narrower main lobe is more conducive to distinguishing between two adjacent paths based on a receiving waveform.

In the conventional UWB protocol, it is assumed that a channel bandwidth is W (the channel bandwidth represented by W herein refers to an available frequency width obtained by dividing a physical channel, and is irrelevant to a specific waveform), and therefore it is required that, at a frequency whose difference with a peak PSD is −10 dB, a PSD bandwidth of a transmitted signal does not exceed $W_{-10}$=1.3×W, and at a frequency whose difference with the peak PSD is −18 dB, a PSD bandwidth of the transmitted signal does not exceed $W_{-18}$=1.6×W. This is also considered as a PSD constraint condition. Currently, in the UWB protocol, a waveform of a transmitted pulse is not specified, and only a constraint that a cross-correlation between an actual transmitted pulse p(t) and an RRC pulse response r(t) needs to meet a specific condition is imposed. For example, when a channel bandwidth is 500 MHZ, a 3 dB width of a time domain waveform envelope of a transmitted pulse that meets a PSD constraint is about 2 ns (that is, when an amplitude of the envelope in time domain is greater than or equal to ½ of a peak amplitude, a time domain span of the pulse is about 2 ns). The protocol requires that a time domain width of a part whose amplitude is greater than 0.8 and that is of a main lobe of a cross-correlation function of p(t) and r(t) is not less than 0.5 ns, and an amplitude of a side lobe of the cross-correlation function of p(t) and r(t) is not greater than 0.3. When the channel bandwidth is W, a time domain expression of an RRC pulse that meets the PSD constraint is as follows:

$$p_{RRC}(t) = \qquad\qquad\qquad\qquad\qquad\qquad\text{(Formula 1)}$$

$$m * \frac{4\alpha}{\pi\sqrt{T_p}} * \frac{\cos\left[(1+\alpha)\pi t/T_p\right] + \sin\left[(1-\alpha)\pi t/T_p\right]/(4\alpha t/T_p)}{1 - (4\alpha t/T_p)^2}$$

Figure 3:
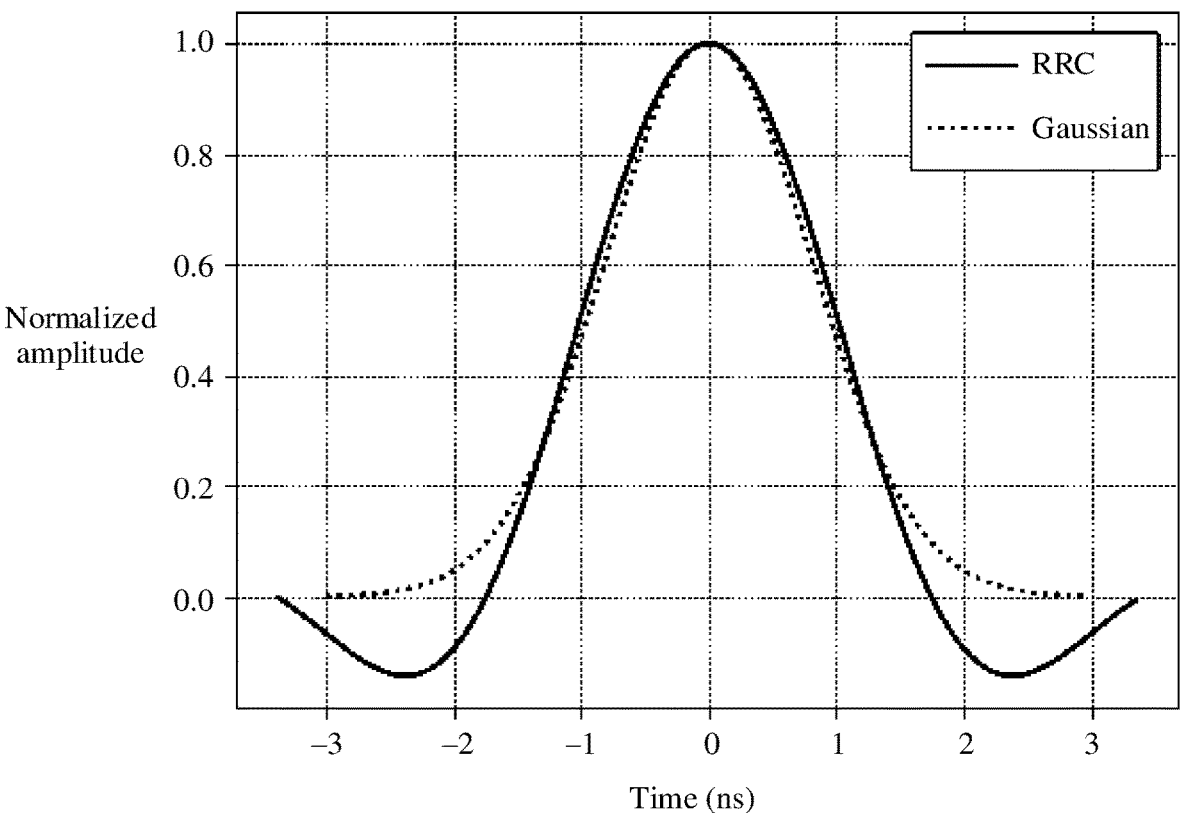
FIG. 3 is a schematic diagram of a time domain waveform of an RRC pulse.
Figure 4:
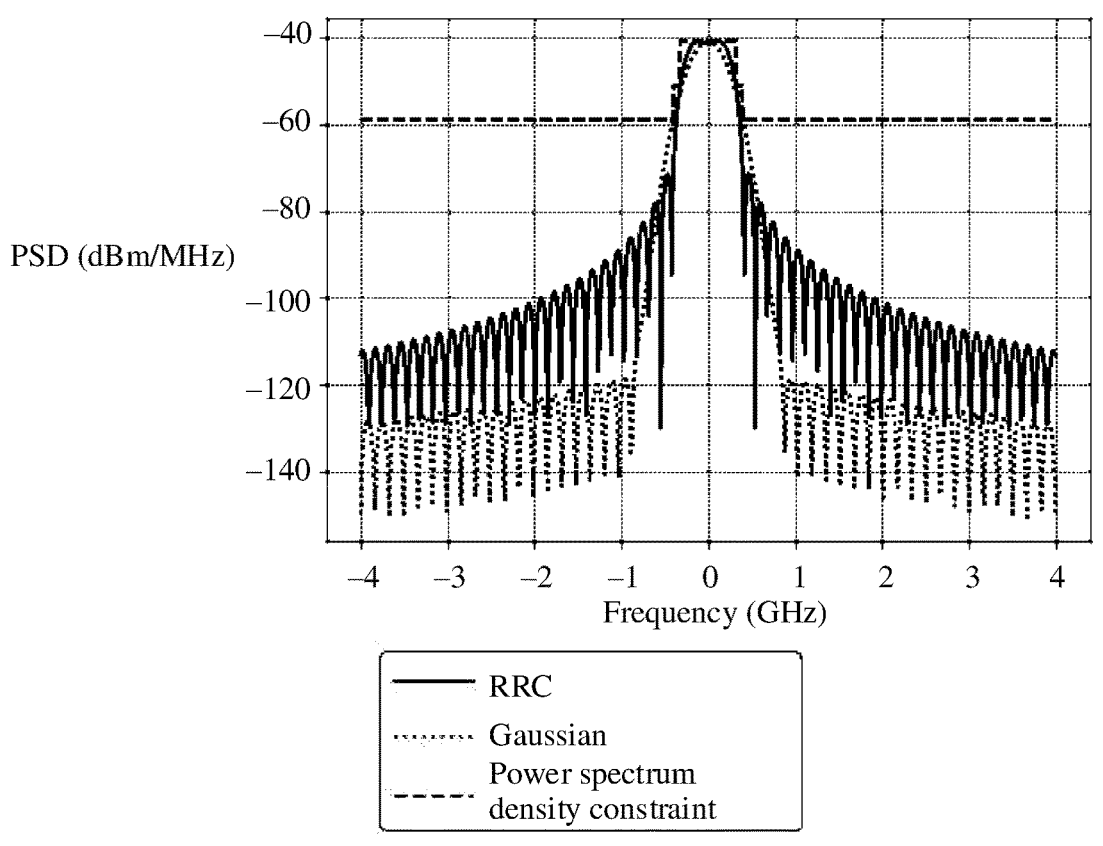
FIG. 4 is a schematic diagram of a power spectrum density of an RRC pulse.

Herein, $\alpha$=0.5, $$T_p = \frac{1}{W},$$

m is an amplitude scaling factor, t is time, and a unit of the time in embodiments of this application is a nanosecond (ns). The amplitude scaling factor is a factor related to transmit power. Different transmit power corresponds to different peak amplitudes, that is, corresponds to different amplitude scaling factors (or corresponds to different values of the amplitude scaling factors). In embodiments of this application, "*" may be understood as a multiplication operation. For example, "*" may also be replaced with "x". A time domain waveform of an RRC pulse is shown by a solid line in FIG. 3, and a vertical axis in FIG. 3 represents a normalized amplitude. A PSD of the RRC pulse is shown by a solid line in FIG. 4, and a vertical axis in FIG. 4 represents the PSD, in a unit of dBm/MHz. In FIG. 4, a long dashed line is a PSD constraint obtained when W=500 MHz. It can be seen from the figure that a waveform of the RRC pulse is within the PSD constraint, and therefore, the PSD constraint condition may be met. It is assumed that power of the waveform of the RRC pulse in a bandwidth A is P, and therefore a spectral efficiency of the RRC pulse may be defined as:

$$P/(J * W_A) \qquad \text{(Formula 2)}$$

P is power $P=\int_{W_A} PSD(f)df$ within a frequency range in which a difference between a PSD and a peak PSD is less than or equal to the bandwidth A. Optionally, the bandwidth A is, for example, −3 dB, −10 dB, or −18 dB. The following uses −10 dB as an example of the bandwidth A. PSD(f) is a function of a PSD of a pulse waveform changing with a frequency. J in Formula 2 is, for example, −41 dBm/MHz, or −41.3 dBm/MHz, or may be another value. The following uses J=−41 dBm/MHz as an example.

When the PSD constraint is met, a higher spectral efficiency for transmitting a pulse indicates higher allowed transmit power. That is, larger P indicates a better coverage. The spectral efficiency of the RRC pulse is high, and is about 72%.

Hardware implementation complexity of the RRC pulse is generally high, and a commonly used transmitted pulse in an actual system is a Gaussian pulse. A time domain expression of the Gaussian pulse is as follows:

$$p_G(t) = m * \sqrt{\beta/\pi} * e^{-\beta t^2} \qquad \text{(Formula 3)}$$

Herein, $$\beta = \pi^2 * BW^2_{-XdB} / (2 * In[10^{X\frac{dB}{10}}])),$$

$BW_{-XdB}$ represents a −X dB bandwidth of a PSD function, namely, a frequency domain width where a difference between a PSD function and a peak value is less than or equal to −X dB, m is an amplitude scaling factor, and/is time. A time domain waveform of the Gaussian pulse is shown by a dashed line in FIG. 3, and a PSD of the Gaussian pulse is shown by a short dashed line in FIG. 4. A spectral efficiency of the Gaussian pulse is about 52%. The time domain waveform of the Gaussian pulse has no side lobe, and a side lobe of a spectrum is low. This helps to reduce interference.

Figure 5:
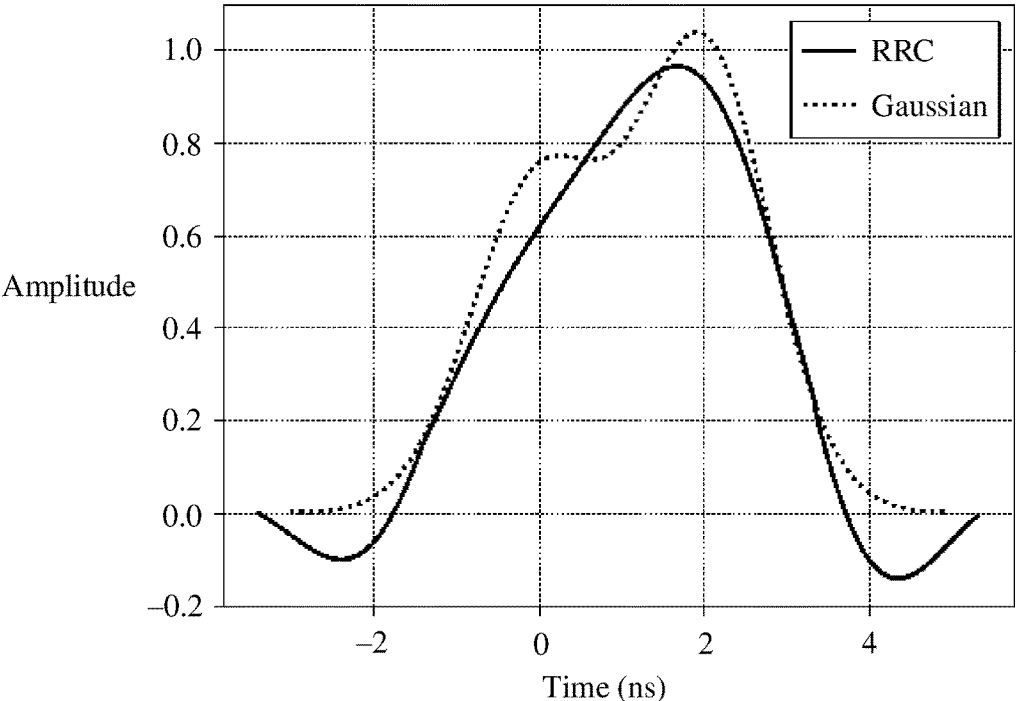
FIG. 5 is a schematic diagram that it is difficult to distinguish between a plurality of paths with short delay intervals by using conventional transmission waveforms.

Currently, a UWB device mainly uses a main lobe symmetric waveform in time domain. For example, waveforms of pulses such as an RRC pulse or a Gaussian pulse are main lobe symmetric waveforms, that is, rising time and falling time of a main lobe are the same. For a specific symmetric waveform, a signal bandwidth determines a pulse width and rising time of a main lobe, that is, strictly determines a capability of distinguishing between a plurality of paths. In a first-arrival-path ranging mechanism based on a received signal, it is difficult to distinguish between a plurality of paths with short delay intervals by using a conventional waveform, and consequently ranging precision is limited. As shown in FIG. 5, it is assumed that there are two paths with a time difference of 2 ns, and therefore energy of a first path is 3 dB weaker than that of a second path. In FIG. 5, a solid line represents a receiving waveform of an RRC pulse, a dashed line represents a receiving waveform of a Gaussian pulse, and a vertical axis represents an amplitude. It can be seen from the figure that the RRC pulse cannot be used to distinguish between the two paths at all. Although the receiving waveform of the Gaussian pulse in FIG. 5 can be used to roughly distinguish between the two paths, an amplitude of a wave peak of the first path is approximately the same as an amplitude of a wave trough of the second path, and waveforms in the figure are continuous. However, during actual application, waveforms obtained by a receiving device may be discrete. Therefore, it is difficult for the receiving device to distinguish between the two paths during actual application.

Through research, an inventor of this application finds that, shorter duration of a rising edge of a main lobe waveform indicates that it is easier to distinguish between two adjacent paths. In view of this, the technical solutions in embodiments of this application are provided. In embodiments of this application, duration of a first rising edge of a first signal is shorter than duration of a first falling edge. In other words, in embodiments of this application, duration of a rising edge of a main lobe waveform of a generated signal is short, the duration of the rising edge of the main lobe waveform is rising time of the main lobe waveform, and shorter rising time of the main lobe waveform is more conducive to distinguishing between two adjacent paths or is more conducive to identifying a first arrival path of a received signal. Therefore, if ranging is performed by using the first signal provided in embodiments of this application, a receiving device can distinguish between a plurality of paths with short delay intervals or more accurately determine arrival time of a first arrival path of the signal. This can improve ranging/positioning precision.

FIG. 6 shows an application scenario according to an embodiment of this application. FIG. 6 includes a sending device and a receiving device. For example, both the two devices are UWB devices. The sending device can send a signal to the receiving device, so that the receiving device can complete a function like ranging. Alternatively, after receiving a signal from the sending device, the receiving device sends a signal to the sending device, and the sending device completes a function like ranging. A specific ranging method is not limited in embodiments of this application. For example, the sending device is a network device, and the receiving device is a terminal device. Alternatively, the sending device is a terminal device, and the receiving device is a network device. Alternatively, both the sending device and the receiving device are network devices. Alternatively, both the sending device and the receiving device are terminal devices.

The technical solutions provided in embodiments of this application are described below with reference to the accompanying drawings.

An embodiment of this application provides a positioning signal sending method. FIG. 7 is a flowchart of the method. In the following description process, an example in which the method is applied to the network architecture shown in FIG. 6 is used. A sending device described below is, for example, the sending device in the network architecture shown in FIG. 6, and a receiving device described below is, for example, the receiving device in the network architecture shown in FIG. 6.

S701: The sending device generates a first signal.

For example, the sending device generates a plurality of pulses based on to-be-sent information. The first signal is, for example, any one of the pulses. The sending device modulates the plurality of pulses to obtain a pulse sequence (for example, FIG. 1 shows a possible pulse sequence). The sending device may send the pulse sequence. In this case, the first signal is sent.

Duration (also referred to as pulse duration) of one pulse is, for example, duration of an element occupied by the pulse. Shorter duration indicates that the receiving device is more likely to distinguish between a plurality of paths based on a waveform of a received signal of the pulse, and ranging precision is higher. Therefore, in embodiments of this application, duration of a first rising edge of the first signal may be less than duration of a first falling edge. The duration of the first rising edge is duration of a rising edge of a first waveform. The duration of the first falling edge is duration of a falling edge of the first waveform. If there is no side lobe in a time domain waveform of the first signal, the first waveform is a waveform of the first signal, for example, the time domain waveform of the first signal. If there is a side lobe in the time domain waveform of the first signal, the first waveform is a main lobe waveform of the first signal, for example, a time domain waveform of a main lobe of the first signal. The time domain waveform of the first signal is uniformly described as the main lobe waveform of the first signal in embodiments of this application, but whether the time domain waveform of the first signal has a side lobe is not limited. It can be learned that the first waveform is an asymmetric waveform in time domain. In embodiments of this application, an asymmetric waveform is used, to reduce duration of a rising edge, so that the receiving device can better distinguish between a plurality of paths. In one embodiment, rising time of a main lobe waveform is defined as time elapsed from a low amplitude to a high amplitude of a rising edge of a main lobe waveform. The low amplitude may be 10% of a peak amplitude, or may be any amplitude less than or equal to 20% of the peak amplitude. The high amplitude may be 90% of the peak amplitude, or may be any amplitude greater than or equal to 80% of the peak amplitude. For example, the duration of the first rising edge is the duration of the rising edge of the first waveform from 10% of a peak amplitude of the first signal to 90% of the peak amplitude. Falling time of the main lobe waveform is defined as time from 90% of the peak amplitude to 10% of the peak amplitude of a falling edge of the main lobe waveform. For example, the duration of the first falling edge is the duration of the falling edge of the first waveform from 90% of the peak amplitude of the first signal to 10% of the peak amplitude.

Optionally, the duration of the first rising edge may be less than a second threshold, and the second threshold is, for example, duration of a rising edge of a symmetric Gaussian pulse waveform under a PSD constraint the same as that in embodiments of this application. For example, when a channel bandwidth is W=500 MHZ, a PSD constraint is that at a frequency whose difference from a peak PSD is-10 dB, a PSD bandwidth $W_{-10}$ of a transmitted signal is less than or equal to 1.3×W=650 MHZ, and at a frequency whose difference from the peak PSD is −18 dB, a PSD bandwidth W 18 of the transmitted signal is less than or equal to 1.6×W=800 MHZ. Under the PSD constraint, the duration of the rising edge of the symmetric Gaussian pulse waveform is 1.38 ns, and the second threshold may be set to 1.38 ns. In other words, the duration of the first rising edge in embodiments of this application is less than the duration of the rising edge of the conventional symmetric Gaussian pulse waveform. This can improve ranging precision.

However, shorter pulse duration indicates larger signal bandwidth, that is, more frequency domain resources are required for support. Therefore, in embodiments of this application, a difference between a third threshold and a sum of the duration of the first rising edge and the duration of the first falling edge may be less than or equal to a fourth threshold. The third threshold is twice the second threshold. For example, if the second threshold is the rising edge duration of the symmetric Gaussian pulse waveform under the PSD constraint the same as that in embodiments of this application, the third threshold is duration (namely, a sum of the rising edge duration and falling edge duration) of the symmetric Gaussian pulse waveform under the PSD constraint the same as that in embodiments of this application. The fourth threshold is greater than or equal to 0. In other words, a difference between duration of the first waveform (or pulse duration of the first signal, namely, a sum of the duration of the first rising edge and the duration of the first falling edge) and duration of a conventional transmitted pulse waveform is small. Even if the fourth threshold is 0, the duration of the first waveform is equal to the duration of the conventional transmitted pulse waveform. Therefore, it can be ensured as much as possible that the duration of the first waveform remains unchanged for the conventional transmitted pulse waveform. In this way, occupation of frequency domain resources is reduced, to save resources. It should be noted that, in a waveform of an actual signal, there may be a flat area between a rising edge and a falling edge, that is, after the rising edge, the waveform enters the flat area, and in the flat area, amplitudes of the signal are at peak values. After the flat area, the waveform enters the falling edge. Therefore, pulse duration of the signal actually needs to include duration of the flat area. However, a case in which there is a flat area is not conducive to improving ranging precision. Therefore, in embodiments of this application, the flat area of the first waveform may be ignored. Alternatively, in embodiments of this application, when the first signal is obtained through splicing, a flat area of a second waveform and/or a flat area of a third waveform may not be included. Alternatively, in embodiments of this application, when the first signal is obtained through splicing, a flat area of a second waveform and/or a flat area of a third waveform may be included. In other words, the first waveform also has a flat area. However, the duration of the first waveform in embodiments of this application may not include duration of the flat area of the first waveform.

The duration of the first rising edge is reduced for duration of a conventional rising edge. However, to ensure that the duration of the first waveform is approximately the same as the duration of the conventional transmitted pulse waveform, an optional manner is increasing the duration of the falling edge of the first waveform (for example, making the duration of the first falling edge greater than the second threshold), so that the duration of the first waveform approximately remains unchanged for the duration of the conventional transmitted pulse waveform. It can be learned that the first waveform in embodiments of this application is an asymmetric waveform in time domain, that is, the duration of the first rising edge is not equal to the duration of the first falling edge.

According to the technical solution in embodiments of this application, duration of a rising edge of a transmitted pulse waveform can be reduced without increasing frequency domain resources, so that when a delay between a first arrival path and an adjacent path of the signal is short, a receiving device can also distinguish between the first arrival path and the adjacent path based on a receiving waveform. This improves ranging precision.

As described above, the first waveform is an asymmetric waveform in time domain. In this case, a manner in which the sending device generates the first signal is as follows: The sending device may generate a second signal and a third signal, where both a time domain waveform of a main lobe of the second signal (which is referred to as a second waveform) and a time domain waveform of a main lobe of the third signal (which is referred to as a third waveform) are symmetric waveforms in time domain, to obtain the first signal based on the second signal and the third signal. For example, the first waveform is obtained by splicing a part of the second waveform and a part of the third waveform. In an optional splicing manner, the rising edge of the first waveform is determined based on a rising edge of the second waveform, and the falling edge of the first waveform is determined based on a falling edge of the second waveform. The first rising edge is the rising edge of the first waveform, and duration of the first rising edge is the duration of the first rising edge. The first falling edge is the falling edge of the first waveform, and duration of the first falling edge is the duration of the first falling edge.

The second waveform and the third waveform are different. That the two waveforms are different includes, for example, that duration of the second waveform and duration of the third waveform are different, and/or that an amplitude of the second waveform and an amplitude of the third waveform are different. This specification mainly uses an example in which the duration of the second waveform and the duration of the third waveform are different. Both duration of a second rising edge and duration of a second falling edge are equal to the duration of the first rising edge, the duration of the second rising edge is duration of the rising edge of the second waveform, and the duration of the second falling edge is duration of the falling edge of the second waveform. For example, if the second signal is represented as $p_1(t)$, and the duration of the second waveform is $T_1$, the duration of the first rising edge, the duration of the second rising edge, and the duration of the second falling edge are all $T_1/2$. Both duration of a third rising edge and duration of a third falling edge are equal to the duration of the first falling edge, the duration of the third rising edge is duration of a rising edge of the third waveform, and the duration of the third falling edge is duration of a falling edge of the third waveform. For example, if the third signal is represented as $p_2(t)$, and the duration of the third waveform is $T_2$, the duration of the first falling edge, the duration of the third rising edge, and the duration of the third falling edge are all $T_2/2$. That is, the second waveform is a symmetric waveform in time domain, and overall duration of the second waveform is twice the duration of the first rising edge. The third waveform is also a symmetric waveform in time domain, and overall duration of the third waveform is twice duration of the first falling edge. The first waveform is obtained based on the second waveform and the third waveform, which is equivalent to that the first waveform uses the rising edge of the second waveform and the falling edge of the third waveform, or in other words, the rising edge of the second waveform is used as the rising edge of the first waveform, and the falling edge of the third waveform is used as the falling edge of the first waveform. In this way, the duration of the first waveform is $T=T_1/2+T_2/2$. It is clear that T is greater than $T_1$. Therefore, duration of the rising edge of the first waveform $T_1/2$ may be shorter than duration of a rising edge of a symmetric waveform T/2 in a same bandwidth. This is conducive to improving precision of measuring a first arrival path. When the sending device actually sends the first signal, it is assumed that the sending device starts to send a pulse from t=0, and therefore the sending device may send the first signal according to a rising edge waveform of $p_1(t)$ within time $0\sim T_1/2$, and may send the first signal according to a falling edge waveform of $p_2(t)$ within time $T_1/2\sim T$.

Both the second waveform and the third waveform are symmetric waveforms in time domain. Therefore, the second signal has a plurality of implementations, and the third signal also has a plurality of implementations. For example, the second signal is any one of a Gaussian pulse signal, an RRC pulse signal, or a triangular pulse signal. The third signal may also be any one of a Gaussian pulse signal, an RRC pulse signal, or a triangular pulse signal. For example, both the second signal and the third signal are Gaussian pulse signals; both the second signal and the third signal are RRC pulse signals; both the second signal and the third signal are triangular pulse signals; the second signal is a Gaussian pulse signal, and the third signal is an RRC pulse signal; the second signal is an RRC pulse signal, and the third signal is a Gaussian pulse signal; the second signal is a Gaussian pulse signal, and the third signal is a triangular pulse signal; the second signal is a triangular pulse signal, and the third signal is a Gaussian pulse signal; the second signal is a triangular pulse signal, and the third signal is an RRC pulse signal; or the second signal is an RRC pulse signal, and the third signal is a triangular pulse signal.

In addition, to meet the PSD constraint, a ratio of duration of a rising edge to duration of a falling edge of a main lobe needs to meet a specific relationship. For example, a ratio of the duration of the first rising edge to the duration of the first falling edge is greater than or equal to a first threshold, and the first threshold is determined based on the PSD constraint condition. If the ratio of the first rising edge duration to the first falling edge duration is greater than or equal to the first threshold, the first waveform can meet the PSD constraint. A value of the first threshold is related to implementations of the second signal and the third signal.

Several implementations of the second signal and the third signal are described below by using examples, and related content of the first threshold is also described.

1. Both the second signal and the third signal are Gaussian pulse signals.

For example, the second signal is a Gaussian pulse signal with a narrow main lobe, and the third signal is a Gaussian pulse signal with a wide main lobe. The rising edge of the first waveform is the rising edge of the second signal, and the falling edge of the first waveform is the falling edge of the third signal.

A time domain expression of the second signal is as follows:

$$p_1(t) = c_1 * \sqrt{\beta_1/\pi} * e^{-\beta_1 t^2} \qquad \text{(Formula 4)}$$

15

Herein, $\beta_1 = (\pi^2 * BW1_{-XdB}^2)/(2 * \ln[10^{XdB/10}])$, $c_1$ is an amplitude scaling factor, $BW1_{-XdB}$ represents a $-X$ dB bandwidth of the second signal, and/represents time. A parameter that affects a main lobe width of the second signal is, for example, $BW1_{-XdB}$. Larger $BW1_{-XdB}$ indicates a smaller main lobe width of the second signal, and the main lobe width of the second signal may be adjusted by adjusting $BW1_{-XdB}$.

A time domain expression of the third signal is as follows:

$$p_2(t) = c_2 * \sqrt{\beta_2/\pi} * e^{-\beta_2 t^2} \qquad \text{(Formula 5)}$$

Herein, $\beta_2 = (\pi^2 * BW2_{-XdB}^2)/(2 * \ln[10^{XdB/10}])$, $c_2$ is an amplitude scaling factor, $BW2_{-XdB}$ represents a $-X$ dB bandwidth of the third signal, and t represents time. A parameter that affects a main lobe width of the third signal is, for example, $BW2_{-XdB}$. Larger $BW2_{-XdB}$ indicates a smaller main lobe width of the third signal, and the main lobe width of the third signal may be adjusted by adjusting $BW2_{-XdB}$.

A time domain expression of the first signal is, for example, $$p(t) = p_1(t)|_{t \leq 0} + p_2(t)|_{t > 0} \qquad \text{(Formula 6)}$$

For example, $p_1(0) = p_2(0)$.

By adjusting $BW2_{-XdB}$ and/or $BW1_{-XdB}$, the main lobe width of the second signal may be less than the main lobe width of the third signal, that is, the duration of the first rising edge is less than the duration of the first falling edge. For example, under a PSD constraint of the 500 MHz channel bandwidth, duration of a rising edge of a symmetric Gaussian pulse waveform is 1.38 ns, and therefore the second threshold is set to 1.38 ns. By setting $BW1_{-XdB}$, duration of a rising edge of a main lobe waveform of the second signal may be less than 1.38 ns, and by setting $BW2_{-XdB}$, duration of a falling edge of a main lobe waveform of the third signal (or duration of a rising edge, where the main lobe waveform of the third signal is a symmetric waveform, and the duration of the rising edge is equal to the duration of the falling edge, which is not described in the following) may be greater than or equal to 1.38 ns.

FIG. 8 is a schematic diagram of a first waveform. A curve shown by a solid line in FIG. 8 is the first waveform, and is also marked by "Gaussian+Gaussian" in FIG. 8. FIG. 8 further includes a dashed line waveform, where the dashed line waveform is a waveform of a Gaussian pulse sent by a conventional UWB device, and is marked by "Gaussian". It can be seen that, compared with that of a conventional Gaussian pulse waveform, the rising edge of the first waveform is obviously shortened.

Figure 9:
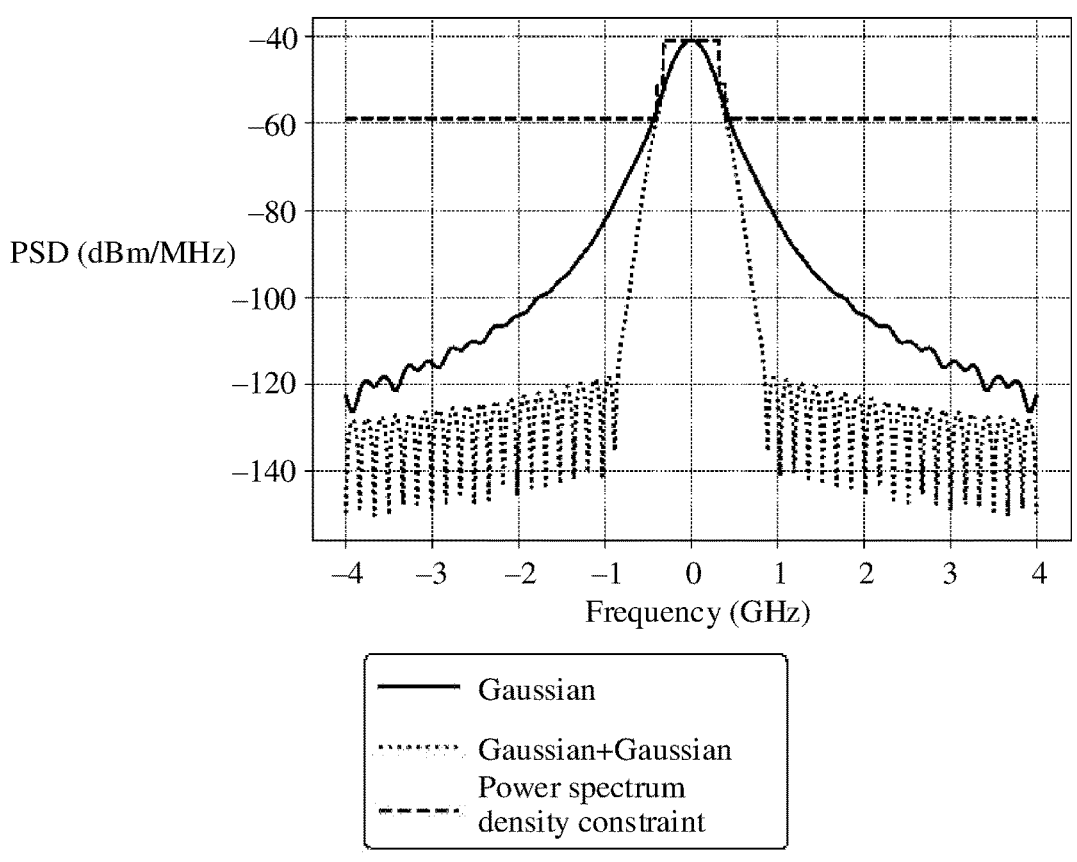
FIG. 9 is a schematic diagram of a power spectrum density of a first signal according to an embodiment of this application.

When both a second signal and a third signal are Gaussian pulses, a first threshold is, for example ½. For example, if duration of a first rising edge is represented by $T_u$, and duration of a first falling edge is represented by $T_d$, $T_u : T_d = BW2_{-XdB} : BW1_{-XdB} \geq 1:2$. For example, when X=18, $BW1_{-XdB}$=1200 MHZ, and $BW2_{-XdB}$=600 MHz, $T_u : T_d$ may be greater than or equal to ½. In addition, in this case, spectral efficiency of a first signal is 52%, and is the same as spectral efficiency of a corresponding Gaussian pulse. It is equivalent to that in embodiments of this application, ranging precision can be improved without changing spectral efficiency. FIG. 9 is a schematic diagram of a power spectrum density of a first signal. A vertical axis of the schematic diagram represents the power spectrum density, and a unit is dBm/MHz. In FIG. 9, a solid line curve represents the first signal (which is marked by "Gaussian+Gaussian"), and a short dashed line curve represents a conventional Gaussian pulse signal (which is marked by "Gaussian"). In addition, a long dashed line in FIG. 9 represents a PSD constraint. It can be seen that a first waveform is within a range of the PSD constraint.

Figure 10:
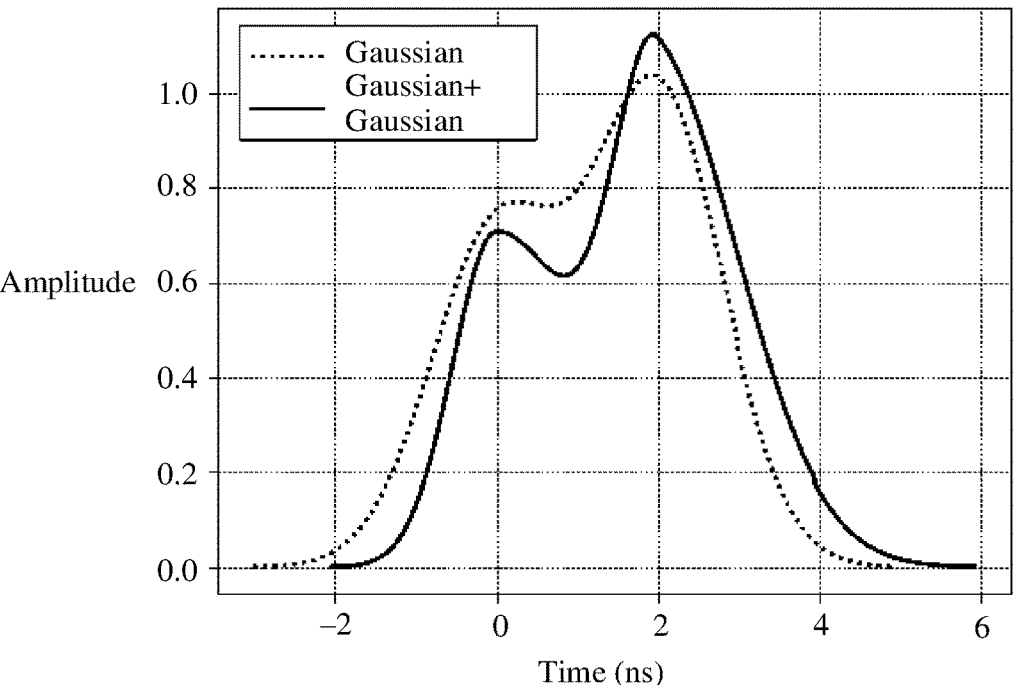
FIG. 10 is a schematic diagram of a receiving waveform of a first signal according to an embodiment of this application.

Refer to FIG. 10. A solid line curve represents a receiving waveform (which is marked by "Gaussian+Gaussian") of a first signal, a dashed line curve represents a receiving waveform (which is marked by "Gaussian") of a Gaussian pulse signal sent by a conventional UWB device, and a vertical axis represents an amplitude. It can be seen that, main lobe rising time (the main lobe rising time is duration of a rising edge of a main lobe) of a first pulse is 0.94 ns, and main lobe rising time of a Gaussian pulse is 1.38 ns. A first waveform has shorter main lobe rising time. Therefore, this is more conducive for the receiving device to distinguishing between two paths with a shorter time interval based on the receiving waveform. For example, it can be seen from FIG. 10 that, it is easier to distinguish between two paths with an interval of 2 nanoseconds (ns) by using the first signal than the Gaussian pulse signal.

2. The second signal is a Gaussian pulse signal, and the third signal is an RRC pulse signal.

For example, the second signal is a Gaussian pulse signal with a narrow main lobe, and the third signal is an RRC pulse signal with a wide main lobe. The rising edge of the first waveform is the rising edge of the second signal, and the falling edge of the first waveform is the falling edge of the third signal.

For a time domain expression of the second signal, refer to Formula 4.

A time domain expression of the third signal is as follows:

$$p_2(t) = \qquad \text{(Formula 7)}$$
$$c_2 * \frac{4\alpha}{\pi\sqrt{T_{p2}}} * \frac{\cos[(1+\alpha)\pi t/T_{p2}] + \sin[(1-\alpha)\pi t/T_{p2}]/(4\alpha t/T_{p2})}{1 - (4\alpha t/T_{p2})^2}$$

Herein, $\alpha$=0.5, $T_{p2}$ is a pulse waveform main lobe width adjustment parameter, $c_2$ is an amplitude scaling factor, and t is time. Larger $T_{p2}$ indicates a larger main lobe width of the third signal, and the main lobe width of the third signal may be adjusted by adjusting $T_{p2}$.

A time domain expression of the first signal is, for example, $$p(t) = p_1(t)|_{t \leq 0} + p_2(t)|_{t > 0} \qquad \text{(Formula 8)}$$

For example, $p_1(0) = p_2(0)$.

By adjusting $BW1_{-XdB}$ of the second signal and/or $T_{p2}$ of the third signal, the main lobe width of the second signal may be less than the main lobe width of the third signal, that is, the duration of the first rising edge is less than the duration of the first falling edge. For example, under the PSD constraint of the 500 MHz channel bandwidth, duration of a rising edge of a symmetric Gaussian pulse waveform is 1.38 ns, and therefore the second threshold is set to 1.38 ns. By setting $BW1_{-XdB}$, duration of a rising edge of a main lobe waveform of the second signal may be less than 1.38 ns, and by setting $T_{p2}$, duration of a falling edge of a main lobe waveform of the third signal may be greater than or equal to 1.38 ns.

Figure 11:
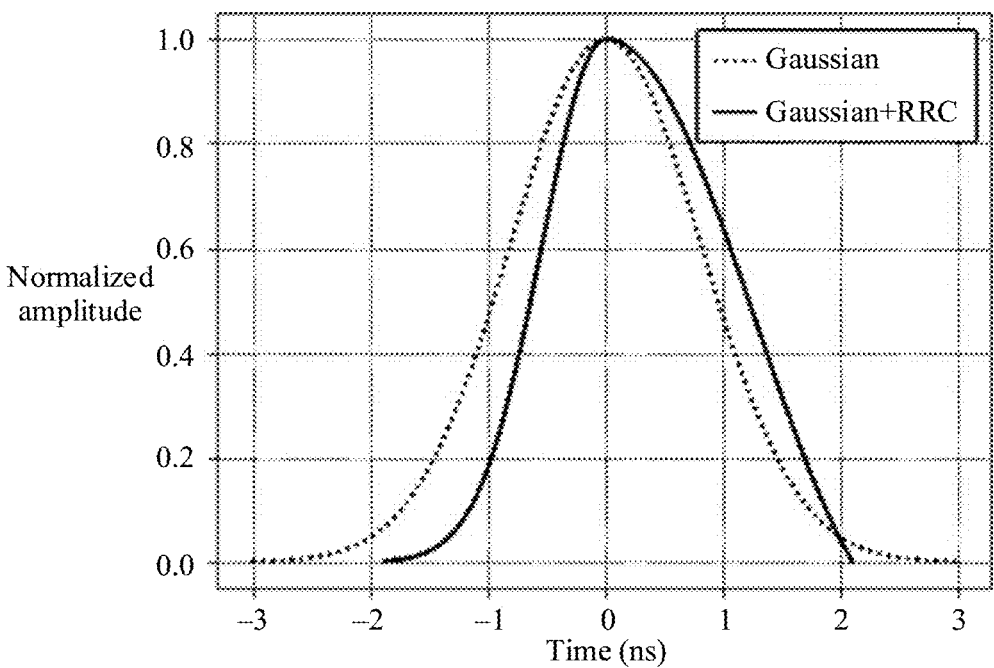
FIG. 11 is a schematic diagram of a first waveform according to an embodiment of this application.

FIG. 11 is a schematic diagram of a first waveform. A curve shown by a solid line in FIG. 11 is the first waveform, and is marked by "Gaussian+RRC" in FIG. 11. FIG. 11 further includes a dashed line waveform, where the dashed line waveform is a waveform of a Gaussian pulse sent by a conventional UWB device, and is marked by "Gaussian". It can be seen that, compared with that of a conventional Gaussian pulse waveform, the rising edge of the first waveform is obviously shortened.

Figure 12:
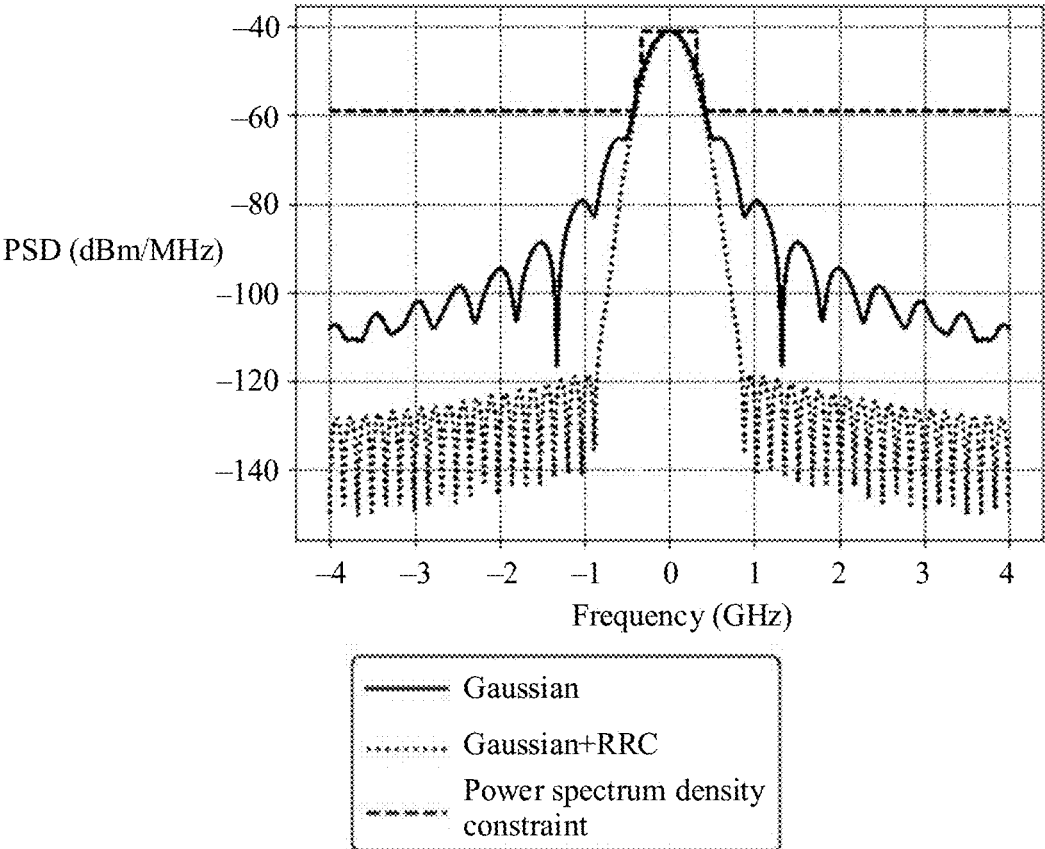
FIG. 12 is a schematic diagram of a power spectrum density of a first signal according to an embodiment of this application.

When the second signal is a Gaussian pulse and the third signal is an RRC pulse, a first threshold is, for example, $\frac{2}{3}$. For example, if duration of a first rising edge is represented by $T_u$, and duration of a first falling edge is represented by $T_d$, $T_u:T_d\geq1:1.5$. For example, when X=18, $BW1_{-XdB}$=1200 MHZ, $T_{p2}$=2.4 ns, $T_u:T_d$ may be greater than or equal to 1/1.5. In addition, in this case, spectral efficiency of a first signal is 59%, and is higher than spectral efficiency of a corresponding Gaussian pulse. This is equivalent to that in embodiments of this application, ranging precision can be improved, and spectral efficiency can also be improved. FIG. 12 is a schematic diagram of a power spectrum density of a first signal. A vertical axis of the schematic diagram represents the power spectrum density, and a unit is dBm/MHz. In FIG. 12, a solid line curve represents the first signal (which is marked by "Gaussian+RRC"), and a short dashed line curve represents a conventional Gaussian pulse signal (which is marked by "Gaussian"). In addition, a long dashed line in FIG. 12 represents a PSD constraint. It can be seen learned that a first waveform is within a range of the PSD constraint.

Figure 13:
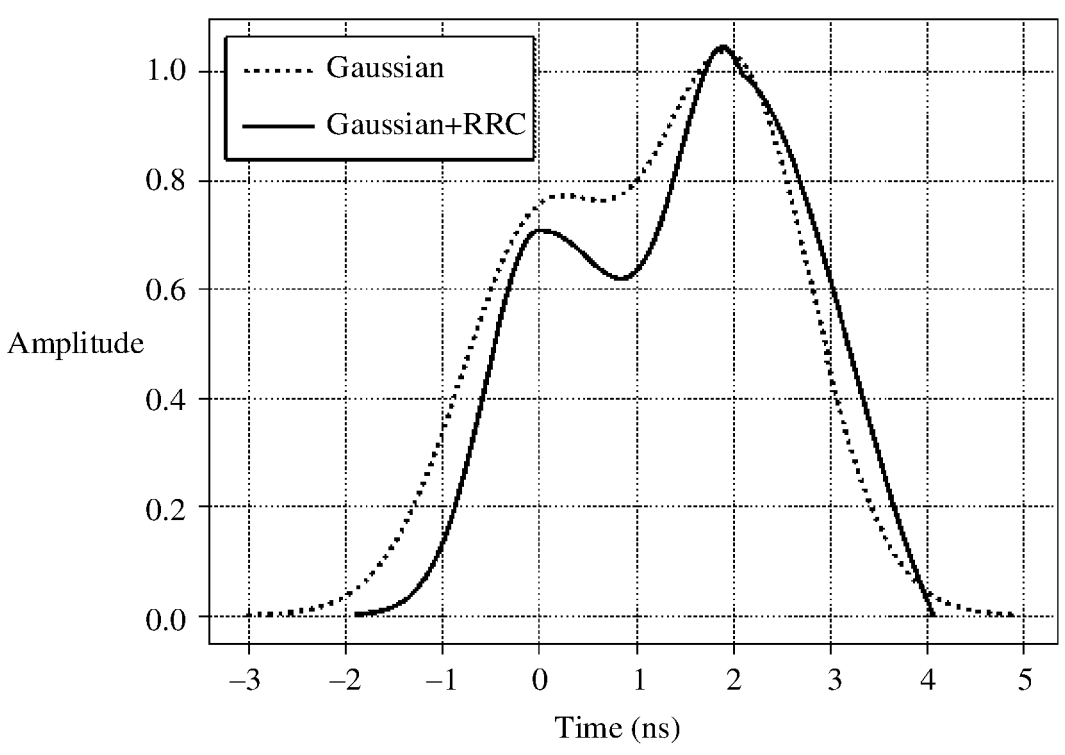
FIG. 13 is a schematic diagram of a receiving waveform of a first signal according to an embodiment of this application.

Refer to FIG. 13. A solid line curve represents a receiving waveform (which is marked by "Gaussian+RRC") of a first signal, a dashed line curve represents a receiving waveform (which is marked by "Gaussian") of a Gaussian pulse signal sent by a conventional UWB device, and a vertical axis represents an amplitude. It can be seen that, main lobe rising time of a first pulse is 0.94 ns, and main lobe rising time of a Gaussian pulse is 1.38 ns. A first waveform has shorter main lobe rising time. Therefore, this is more conducive for the receiving device to distinguishing between two paths with a shorter time interval based on the receiving waveform. For example, it can be seen from FIG. 13 that, it is easier to distinguish between two paths with an interval of 2 ns by using the first signal than the Gaussian pulse signal.

3. The second signal is a Gaussian pulse signal, and the third signal is a triangular pulse signal.

For example, the second signal is a Gaussian pulse signal with a narrow main lobe, and the third signal is a triangular pulse signal with a wide main lobe. The rising edge of the first waveform is the rising edge of the second signal, and the falling edge of the first waveform is the falling edge of the third signal.

For a time domain expression of the second signal, refer to Formula 4.

A time domain expression of the third signal is as follows:

$$p_2(t) + a_2t + b_2 \qquad \text{(Formula 9)}$$

Herein, $0<t\leq-b_2/a_2$, $a_2<0$, and $b_2>0$. $-b_2/a_2$ may affect a main lobe width of the third signal. Larger $-b_2/a_2$ indicates a larger main lobe width of the third signal, and the main lobe width of the third signal may be adjusted by adjusting $-b_2/a_2$.

A time domain expression of the first signal is, for example, $$p(t) = p_1(t)|_{t\leq0} + p_2(t)|_{t>0} \qquad \text{(Formula 10)}$$

For example, $p_1(0)=p_2(0)$.

By adjusting $BW1_{-XdB}$ of the second signal and/or $-b_2/a_2$ of the third signal, the main lobe width of the second signal may be less than the main lobe width of the third signal, that is, the duration of the first rising edge is less than the duration of the first falling edge. For example, under the PSD constraint of the 500 MHz channel bandwidth, duration of a rising edge of a symmetric Gaussian pulse waveform is 1.38 ns, and therefore the second threshold is set to 1.38 ns. By setting $BW1_{-XdB}$, duration of a rising edge of a main lobe waveform of the second signal may be less than 1.38 ns, and by setting $-b_2/a_2$, duration of a falling edge of a main lobe waveform of the third signal may be greater than or equal to 1.38 ns.

Figure 14:
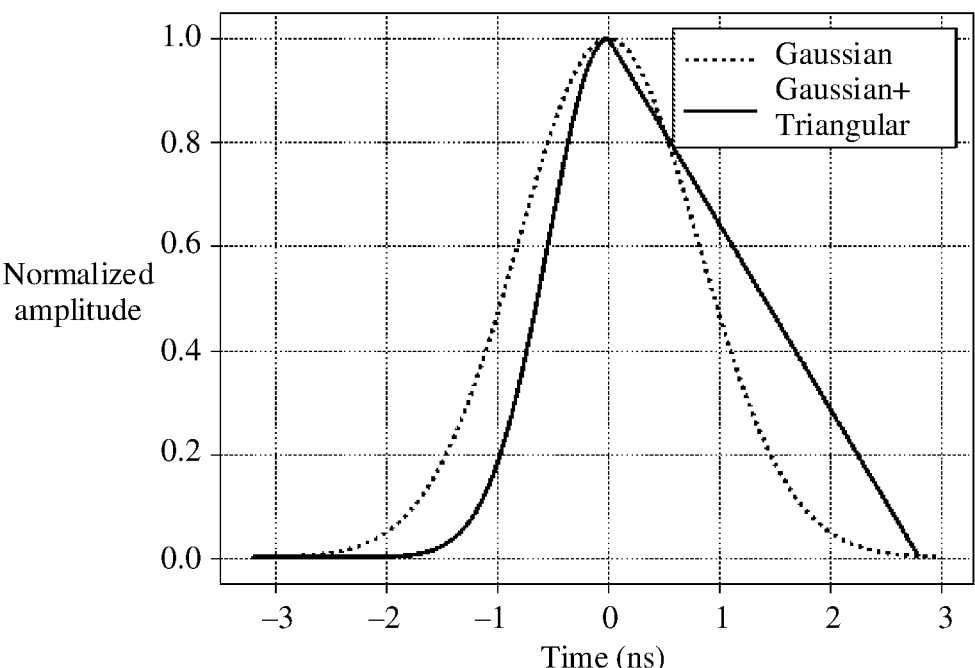
FIG. 14 is a schematic diagram of a first waveform according to an embodiment of this application.

FIG. 14 is a schematic diagram of a first waveform. A curve shown by a solid line in FIG. 14 is the first waveform, and is marked by "Gaussian+Triangular" in FIG. 14. FIG. 14 further includes a dashed line waveform, where the dashed line waveform is a waveform of a Gaussian pulse sent by a conventional UWB device, and is marked by "Gaussian". It can be seen that, compared with that of a conventional Gaussian pulse waveform, the rising edge of the first waveform is obviously shortened.

Figure 15:
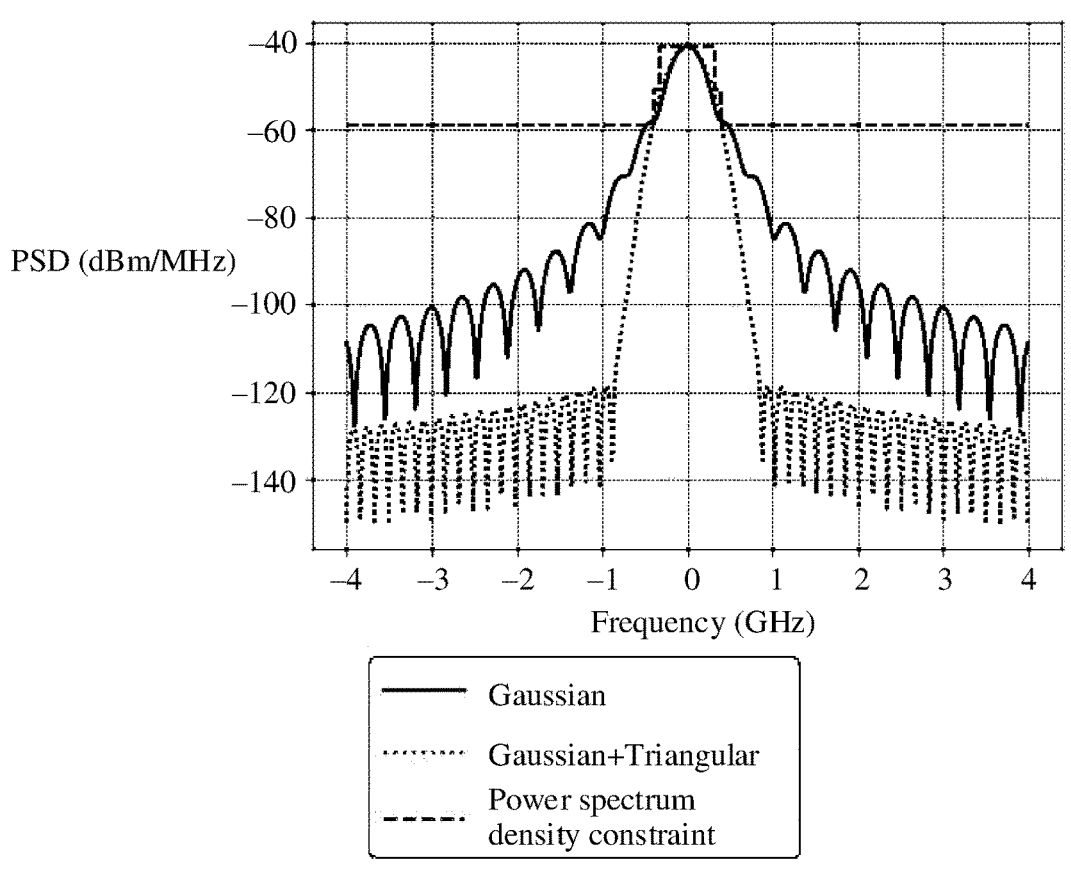
FIG. 15 is a schematic diagram of a power spectrum density of a first signal according to an embodiment of this application.

When the second signal is a Gaussian pulse and the third signal is a triangular pulse, a first threshold is, for example, $\frac{5}{12}$. For example, if duration of a first rising edge is represented by Ty, and duration of a first falling edge is represented by Ta, $T_u:T_d\geq1:2.4$. For example, when X=18, $BW1_{-XdB}$=1200 MHZ, $-b_2/a_2$=2.8, $T_u:T_d$ may be greater than or equal to 1/2.4. In addition, in this case, spectral efficiency of a first signal is 48%, and is not much different from spectral efficiency of a corresponding Gaussian pulse. It is equivalent to that in embodiments of this application, ranging precision can be improved when spectral efficiency is approximately ensured. FIG. 15 is a schematic diagram of a power spectrum density of a first signal. A vertical axis of the schematic diagram represents the power spectrum density, and a unit is dBm/MHz. In FIG. 15, a solid line curve represents the first signal (which is marked by "Gaussian+Triangular"), and a short dashed line curve represents a conventional Gaussian pulse signal (which is marked by "Gaussian"). In addition, a long dashed line in FIG. 15 represents a PSD constraint. It can be seen that a first waveform is within a range of the PSD constraint.

Figure 16:
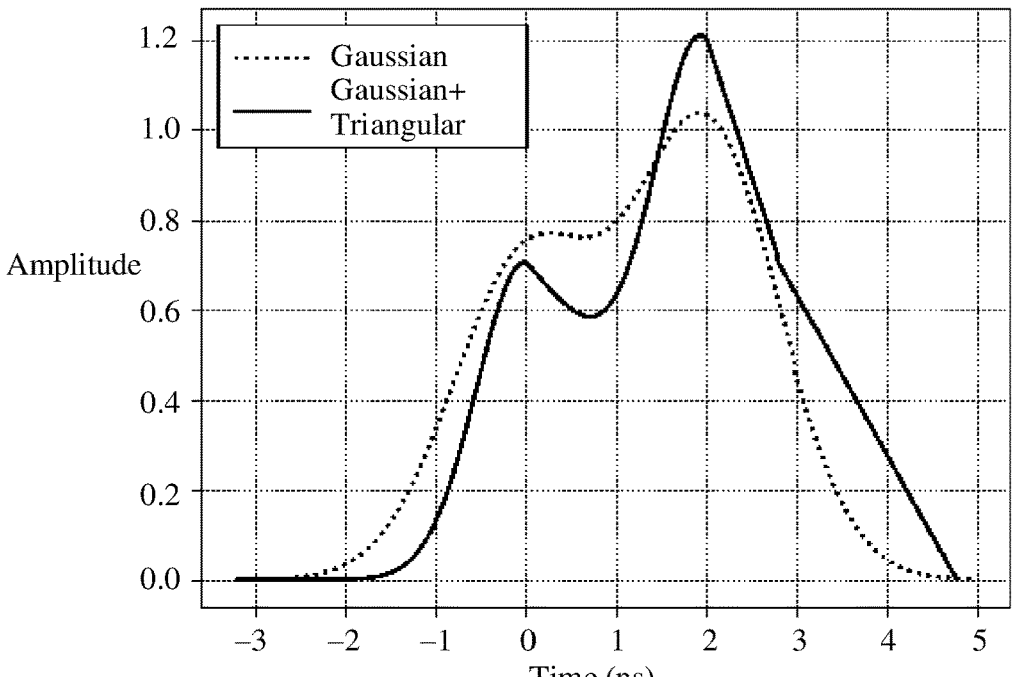
FIG. 16 is a schematic diagram of a receiving waveform of a first signal according to an embodiment of this application.

Refer to FIG. 16. A solid line curve represents a receiving waveform (which is marked by "Gaussian+Triangular") of a first signal, a dashed line curve represents a receiving waveform (which is marked by "Gaussian") of a Gaussian pulse signal sent by a conventional UWB device, and a vertical axis represents an amplitude. It can be seen that, main lobe rising time of a first pulse is 0.94 ns, and main lobe rising time of a Gaussian pulse is 1.38 ns. A first waveform has shorter main lobe rising time. Therefore, this is more conducive for the receiving device to distinguishing between two paths with a shorter time interval based on the receiving waveform. For example, it can be seen from FIG.

16 that, it is easier to distinguish between two paths with an interval of 2 ns by using the first signal than the Gaussian pulse signal.

4. The second signal is a triangular pulse signal, and the third signal is a Gaussian pulse signal.

For example, the second signal is a triangular pulse signal with a narrow main lobe, and the third signal is a Gaussian pulse signal with a wide main lobe. The rising edge of the first waveform is the rising edge of the second signal, and the falling edge of the first waveform is the falling edge of the third signal.

A time domain expression of the second signal is as follows:

$$p_1(t) = a_1 t + b_1 \qquad \text{(Formula 11)}$$

Herein, $-b_1/a_1 \leq t \leq 0$ and $a_1 > 0$, $b_1 > 0$. $b_1/a_1$ may affect a main lobe width of the second signal. Larger $b_1/a_1$ indicates a larger main lobe width of the third signal, and the main lobe width of the third signal may be adjusted by adjusting $b_1/a_1$.

For a time domain expression of the third signal, refer to Formula 5.

A time domain expression of the first signal is, for example, $$p(t) = p_1(t)|_{t \leq 0} + p_2(t)|_{t > 0} \qquad \text{(Formula 12)}$$

For example, $p_1(0) = p_2(0)$.

By adjusting $b_1/a_1$ of the second signal and/or $BW2_{-XdB}$ of the third signal, the main lobe width of the second signal may be less than the main lobe width of the third signal, that is, the duration of the first rising edge is less than the duration of the first falling edge. For example, under the PSD constraint of the 500 MHz channel bandwidth, duration of a rising edge of a symmetric Gaussian pulse waveform is 1.38 ns, and therefore the second threshold is set to 1.38 ns. By setting $b_1/a_1$, duration of a rising edge of a main lobe waveform of the second signal may be less than 1.38 ns, and by setting $BW2_{-XdB}$, duration of a falling edge of a main lobe waveform of the third signal may be greater than or equal to 1.38 ns.

Figure 17:
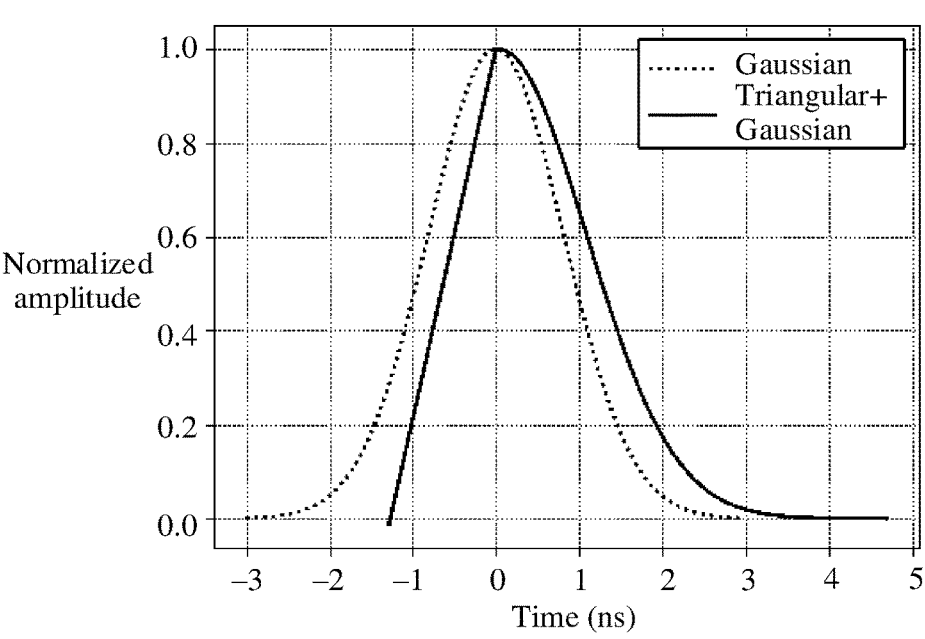
FIG. 17 is a schematic diagram of a first waveform according to an embodiment of this application.

FIG. 17 is a schematic diagram of a first waveform. A curve shown by a solid line in FIG. 17 is the first waveform, and is marked by "Triangular+Gaussian" in FIG. 17. FIG. 17 further includes a dashed line waveform, where the dashed line waveform is a waveform of a Gaussian pulse sent by a conventional UWB device, and is marked by "Gaussian". It can be seen that, compared with that of a conventional Gaussian pulse waveform, the rising edge of the first waveform is obviously shortened.

Figure 18:
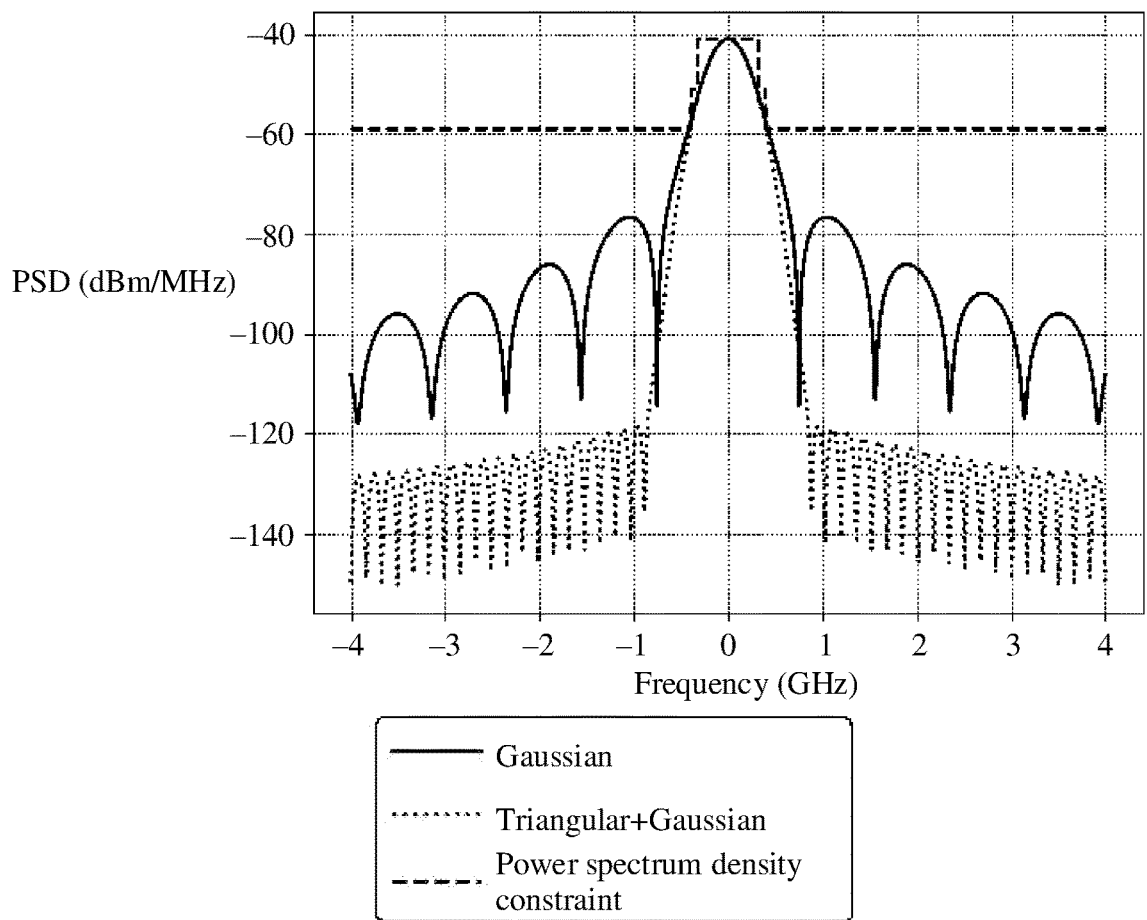
FIG. 18 is a schematic diagram of a power spectrum density of a first signal according to an embodiment of this application.

When the second signal is a triangular pulse and the third signal is a Gaussian pulse, a first threshold is, for example, 5/9. For example, if duration of a first rising edge is represented by $T_u$, and duration of a first falling edge is represented by $T_d$, $T_u : T_d \geq 1 : 1.8$. For example, when $b_1/a_1 = 1.3$, X=18, and $BW2_{-XdB} = 600$ MHZ, $T_u : T_d$ may be greater than or equal to 1/1.8. In addition, in this case, spectral efficiency of a first signal is 52%, and is the same as spectral efficiency of a corresponding Gaussian pulse. It is equivalent to that in embodiments of this application, ranging precision can be improved when spectral efficiency is ensured. FIG. 18 is a schematic diagram of a power spectrum density of a first signal. A vertical axis of the schematic diagram represents the power spectrum density, and a unit is dBm/MHz. In FIG. 18, a solid line curve represents the first signal (which is marked by "Triangular+Gaussian"), and a short dashed line curve represents a conventional Gaussian pulse signal (which is marked by "Gaussian"). In addition, a long dashed line in FIG. 18 represents a PSD constraint. It can be seen that a first waveform is within a range of the PSD constraint.

Figure 19:
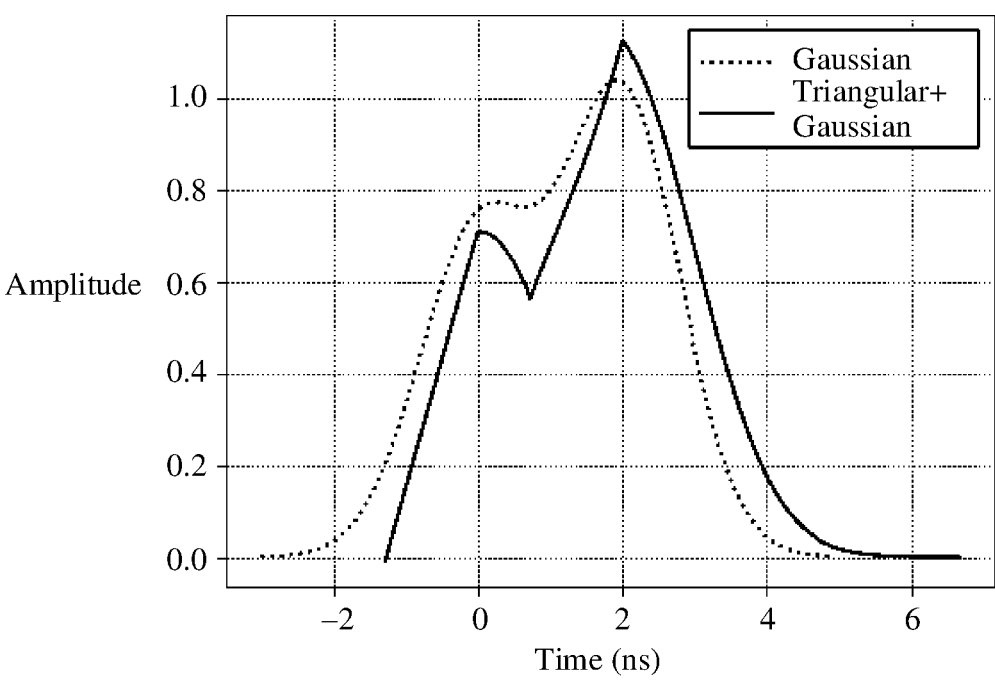
FIG. 19 is a schematic diagram of a receiving waveform of a first signal according to an embodiment of this application.

Refer to FIG. 19. A solid line curve represents a receiving waveform (which is marked by "Triangular+Gaussian") of a first signal, a dashed line curve represents a receiving waveform (which is marked by "Gaussian") of a Gaussian pulse signal sent by a conventional UWB device, and a vertical axis represents an amplitude. It can be seen that, main lobe rising time of a first pulse is 1 ns, and main lobe rising time of a Gaussian pulse is 1.38 ns. A first waveform has shorter main lobe rising time. Therefore, this is more conducive for the receiving device to distinguishing between two paths with a shorter time interval based on the receiving waveform. For example, it can be seen from FIG. 19 that, it is easier to distinguish between two paths with an interval of 2 ns by using the first signal than the Gaussian pulse signal.

5. The second signal is a triangular pulse signal, and the third signal is an RRC pulse signal.

For example, the second signal is a triangular pulse signal with a narrow main lobe, and the third signal is an RRC pulse signal with a wide main lobe. The rising edge of the first waveform is the rising edge of the second signal, and the falling edge of the first waveform is the falling edge of the third signal.

For a time domain expression of the second signal, refer to Formula 11.

For a time domain expression of the third signal, refer to Formula 7.

A time domain expression of the first signal is, for example, $$p(t) = p_1(t)|_{t \leq 0} + p_2(t)|_{t > 0} \qquad \text{(Formula 13)}$$

For example, $p_1(0) = p_2(0)$.

By adjusting $b_1/a_1$ of the second signal and/or $T_{p2}$ of the third signal, the main lobe width of the second signal may be less than the main lobe width of the third signal, that is, the duration of the first rising edge is less than the duration of the first falling edge. For example, under the PSD constraint of the 500 MHz channel bandwidth, duration of a rising edge of a symmetric Gaussian pulse waveform is 1.38 ns, and therefore the second threshold is set to 1.38 ns. By setting $b_1/a_1$, duration of a rising edge of a main lobe waveform of the second signal may be less than 1.38 ns, and by setting $T_{p2}$, duration of a falling edge of a main lobe waveform of the third signal may be greater than or equal to 1.38 ns.

Figure 20:
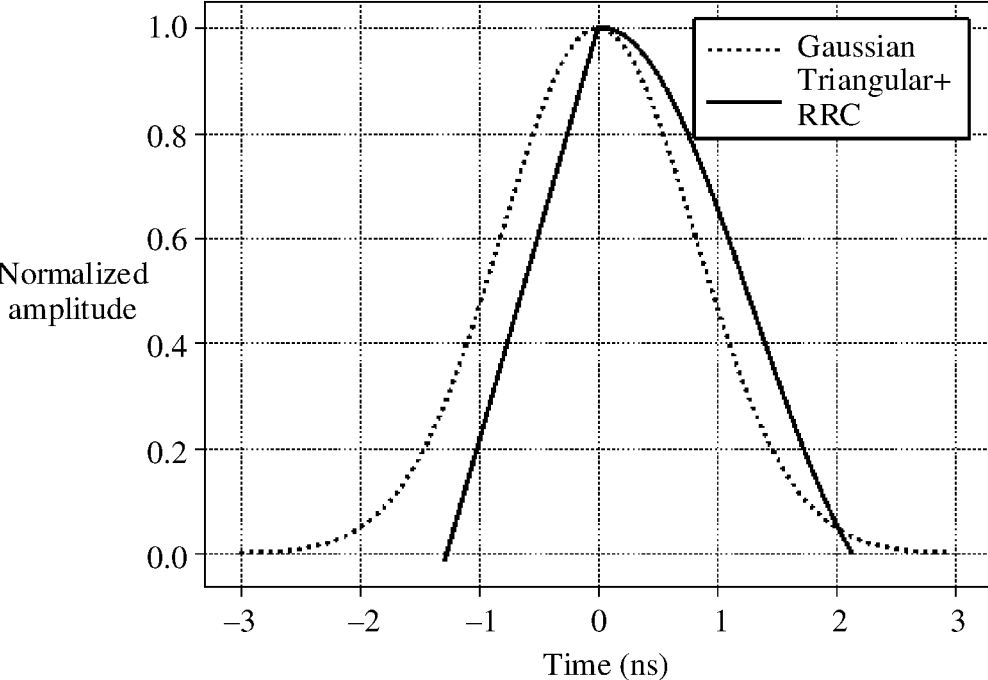
FIG. 20 is a schematic diagram of a first waveform according to an embodiment of this application.

FIG. 20 is a schematic diagram of a first waveform. A curve shown by a solid line in FIG. 20 is the first waveform, and is marked by "Triangular+RRC" in FIG. 17. FIG. 20 further includes a dashed line waveform, where the dashed line waveform is a waveform of a Gaussian pulse sent by a conventional UWB device, and is marked by "Gaussian". It can be seen that, compared with that of a conventional Gaussian pulse waveform, the rising edge of the first waveform is obviously shortened.

Figure 21:
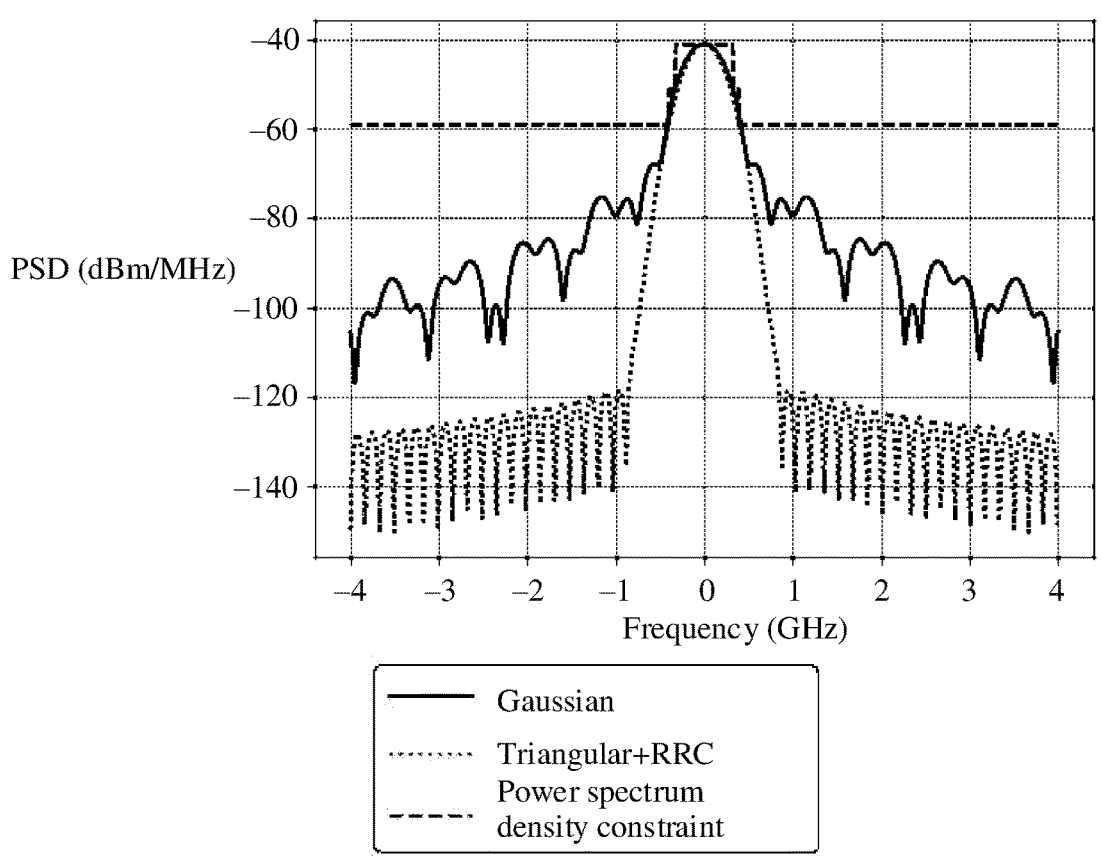
FIG. 21 is a schematic diagram of a power spectrum density of a first signal according to an embodiment of this application.

When the second signal is a triangular pulse and the third signal is an RRC pulse, a first threshold is, for example, 5/7. For example, if duration of a first rising edge is represented by $T_u$, and duration of a first falling edge is represented by $T_d$, $T_u:T_d \geq 1:1.4$. For example, when $b_1/a_1 = 1.3$, and $T_{p2} = 2.4$ ns, $T_u:T_d$ may be greater than or equal to $1/1.4$. In addition, in this case, spectral efficiency of a first signal is 59%, and is higher than spectral efficiency of a corresponding Gaussian pulse. This is equivalent to that in embodiments of this application, ranging precision can be improved, and spectral efficiency can also be improved. FIG. 21 is a schematic diagram of a power spectrum density of a first signal. A vertical axis of the schematic diagram represents the power spectrum density, and a unit is dBm/MHz. In FIG. 21, a solid line curve represents the first signal (which is marked by "Triangular+RRC"), and a short dashed line curve represents a conventional Gaussian pulse signal (which is marked by "Gaussian"). In addition, a long dashed line in FIG. 21 represents a PSD constraint. It can be seen that a first waveform is within a range of the PSD constraint.

Figure 22:
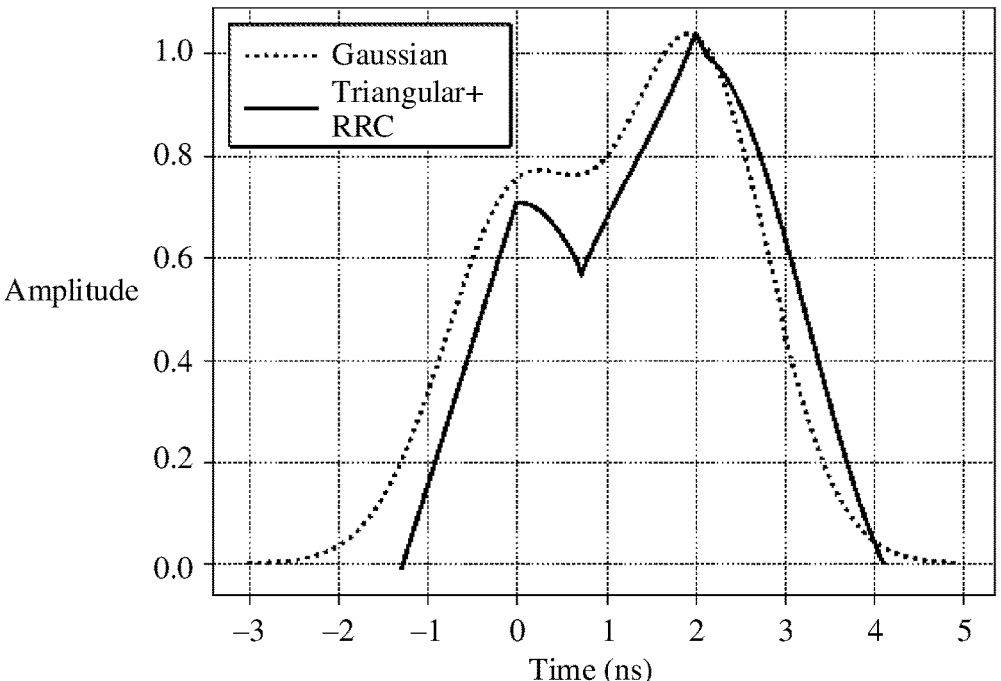
FIG. 22 is a schematic diagram of a receiving waveform of a first signal according to an embodiment of this application.

Refer to FIG. 22. A solid line curve represents a receiving waveform (which is marked by "Triangular+RRC") of a first signal, a dashed line curve represents a receiving waveform (which is marked by "Gaussian") of a Gaussian pulse signal sent by a conventional UWB device, and a vertical axis represents an amplitude. It can be seen that, main lobe rising time of a first pulse is 1 ns, and main lobe rising time of a Gaussian pulse is 1.38 ns. A first waveform has shorter main lobe rising time. Therefore, this is more conducive for the receiving device to distinguishing between two paths with a shorter time interval based on the receiving waveform. For example, it can be seen from FIG. 22 that, it is easier to distinguish between two paths with an interval of 2 ns by using the first signal than the Gaussian pulse signal.

6. Both the second signal and the third signal are triangular pulse signals.

For example, the second signal is a triangular pulse signal with a narrow main lobe, and the third signal is a triangular pulse signal with a wide main lobe. The rising edge of the first waveform is the rising edge of the second signal, and the falling edge of the first waveform is the falling edge of the third signal.

For a time domain expression of the second signal, refer to Formula 11.

For a time domain expression of the third signal, refer to Formula 9.

A time domain expression of the first signal is, for example, $$p(t) = p_1(t)|_{t \leq 0} + p_2(t)|_{t > 0} \qquad \text{(Formula 14)}$$

For example, $p_1(0) = p_2(0)$.

By adjusting $b_1/a_1$ of the second signal and/or $-b_2/a_2$ of the third signal, the main lobe width of the second signal may be less than the main lobe width of the third signal, that is, the duration of the first rising edge is less than the duration of the first falling edge. For example, under the PSD constraint of the 500 MHz channel bandwidth, duration of a rising edge of a symmetric Gaussian pulse waveform is 1.38 ns, and therefore the second threshold is set to 1.38 ns. By setting $b_1/a_1$, duration of a rising edge of a main lobe waveform of the second signal may be less than 1.38 ns, and by setting $-b_2/a_2$, duration of a falling edge of a main lobe waveform of the third signal may be greater than or equal to 1.38 ns.

Figure 23:
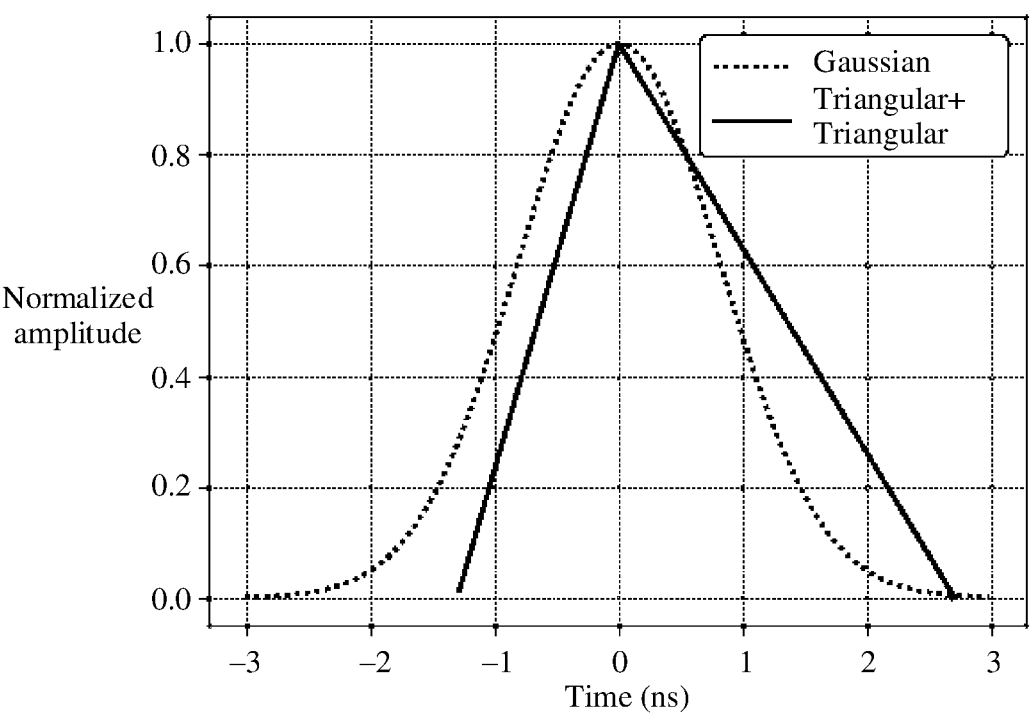
FIG. 23 is a schematic diagram of a first waveform according to an embodiment of this application.

FIG. 23 is a schematic diagram of a first waveform. A curve shown by a solid line in FIG. 23 is the first waveform, and is marked by "Triangular+Triangular" in FIG. 23. FIG.

23 further includes a dashed line waveform, where the dashed line waveform is a waveform of a Gaussian pulse sent by a conventional UWB device, and is marked by "Gaussian". It can be seen that, compared with that of a conventional Gaussian pulse waveform, the rising edge of the first waveform is obviously shortened.

Figure 24:
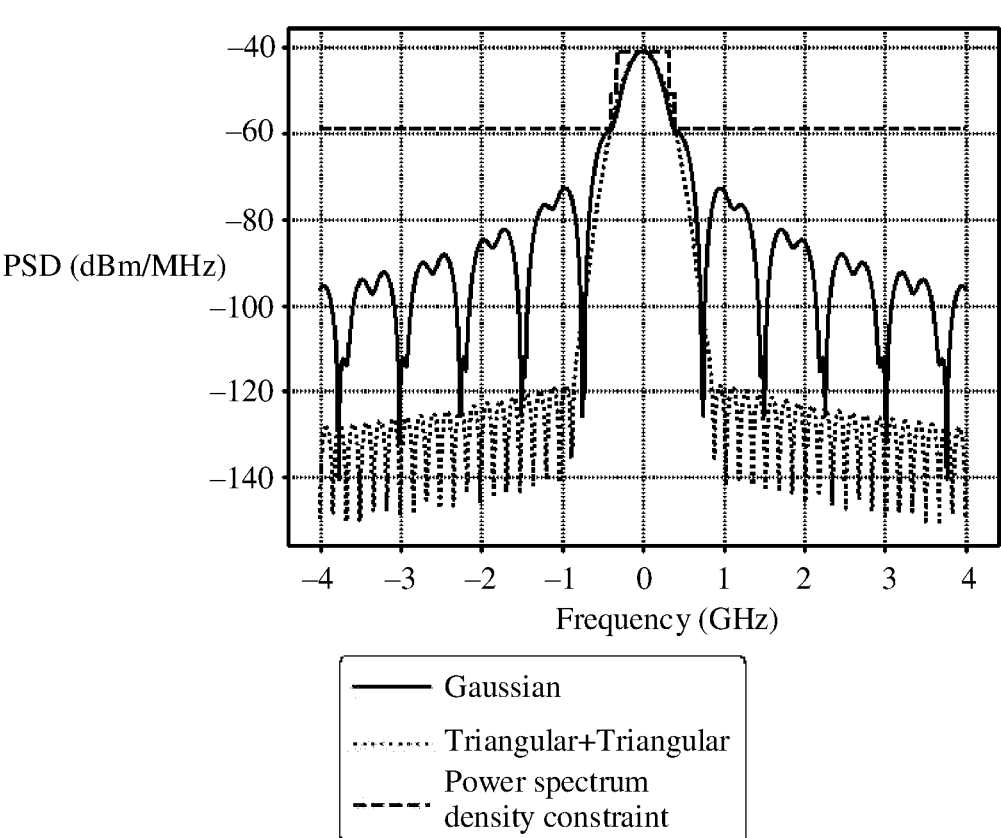
FIG. 24 is a schematic diagram of a power spectrum density of a first signal according to an embodiment of this application.

When both a second signal and a third signal are triangular pulse signals, a first threshold is, for example, $\frac{1}{2}$. For example, if duration of a first rising edge is represented by $T_u$, and duration of a first falling edge is represented by $T_d$, $T_u:T_d \geq 1:2$. For example, when $b_1/a_1 = 1.35$, $-b_2/a_2 = 2.7$, $T_u:T_d$ may be greater than or equal to $\frac{1}{2}$. In addition, in this case, spectral efficiency of a first signal is 49%, and is not much different from spectral efficiency of a corresponding Gaussian pulse. It is equivalent to that in embodiments of this application, ranging precision can be improved when spectral efficiency is approximately ensured. FIG. 24 is a schematic diagram of a power spectrum density of a first signal. A vertical axis of the schematic diagram represents the power spectrum density, and a unit is dBm/MHz. In FIG. 24, a solid line curve represents the first signal (which is marked by "Triangular+Triangular"), and a short dashed line curve represents a conventional Gaussian pulse signal (which is marked by "Gaussian"). In addition, a long dashed line in FIG. 24 represents a PSD constraint. It can be seen that a first waveform is within a range of the PSD constraint.

Figure 25:
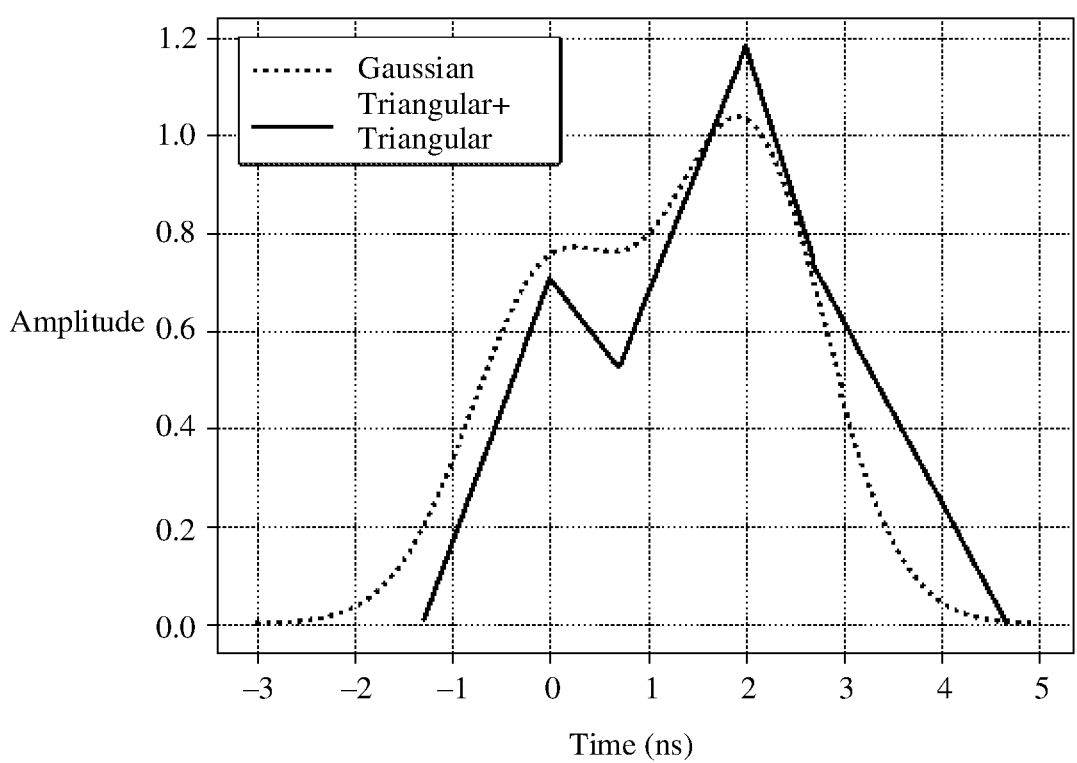
FIG. 25 is a schematic diagram of a receiving waveform of a first signal according to an embodiment of this application.

Refer to FIG. 25. A solid line curve represents a receiving waveform (which is marked by "Triangular+Triangular") of a first signal, a dashed line curve represents a receiving waveform (which is marked by "Gaussian") of a Gaussian pulse signal sent by a conventional UWB device, and a vertical axis represents an amplitude. It can be seen that, main lobe rising time of a first pulse is 1 ns, and main lobe rising time of a Gaussian pulse is 1.38 ns. A first waveform has shorter main lobe rising time. Therefore, this is more conducive for the receiving device to distinguishing between two paths with a shorter time interval based on the receiving waveform. For example, it can be seen from FIG. 25 that, it is easier to distinguish between two paths with an interval of 2 ns by using the first signal than the Gaussian pulse signal.

S702: The sending device sends the first signal. Correspondingly, the receiving device receives the first signal.

After receiving the first signal, the receiving device may detect the first signal. For example, the sending device sends a pulse sequence, and the receiving device may perform an operation such as cross-correlation on the received pulse sequence, to determine which pulse sequence the received pulse sequence is, and the receiving device obtains a pulse included in the pulse sequence. For example, the receiving device obtains a first signal, and the receiving device may determine a first arrival path of the first signal, to determine a distance between the receiving device and a transmit end (that is, the sending device) of the first signal based on the first arrival path. In this way, ranging is completed, and positioning of the sending device can also be correspondingly completed.

In embodiments of this application, that the receiving device performs ranging is used as an example. Alternatively, the sending device may send a signal to the receiving device. After receiving the signal, the receiving device may send a signal to the sending device, and the sending device performs ranging based on the received signal. In this case, after the signal is received, the signal sent by the receiving device to the sending device may be a first signal, and the signal sent by the sending device is not limited.

In embodiments of this application, the duration of the first rising edge of the first signal is less than the duration of the first falling edge. In other words, rising time of a main lobe waveform of a signal generated in embodiments of this application is short, and shorter rising time of the main lobe waveform is more conducive to distinguishing between two adjacent paths, or is more conducive to identifying a first arrival path of a received signal. Therefore, ranging is performed by using the first signal provided in embodiments of this application, so that a receiving device can distinguish between a plurality of paths with short delay intervals, or a receiving device can more accurately determine arrival time of a first arrival path of a signal. This can improve ranging and/or positioning precision. In addition, in embodiments of this application, it can be ensured as much as possible that the duration of the first signal remains unchanged for conventional duration of a sent signal, to reduce occupation of frequency domain resources.

Figure 26:
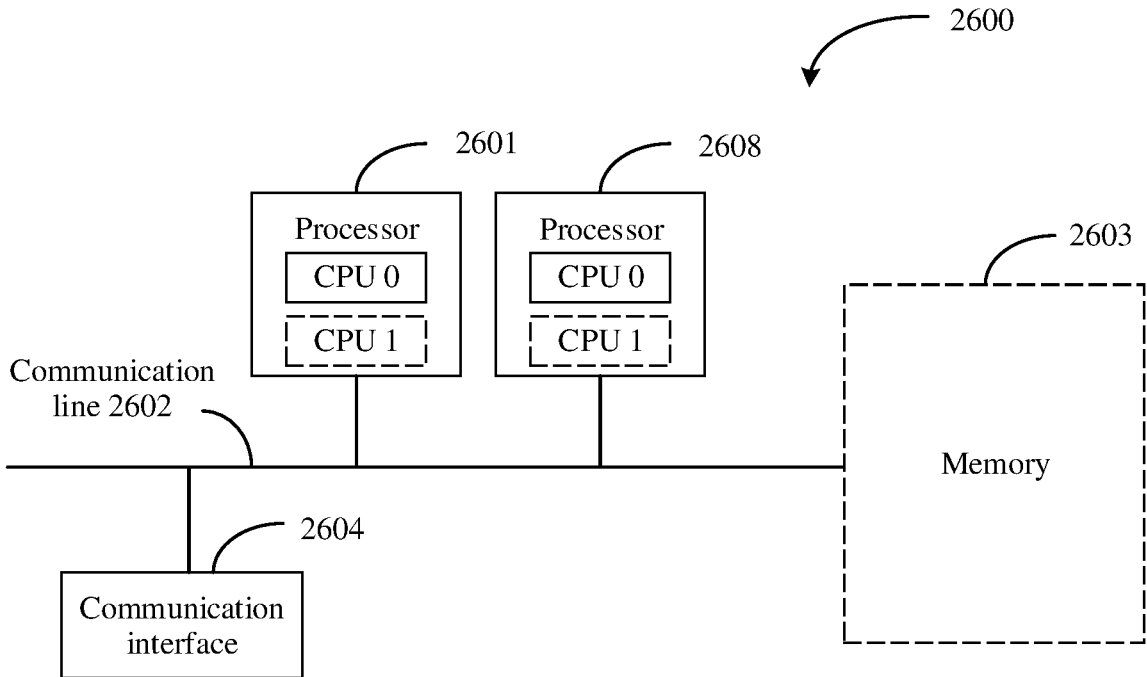
FIG. 26 is a schematic diagram of an apparatus according to an embodiment of this application.

FIG. 26 is a schematic diagram of a structure of a positioning signal sending apparatus according to an embodiment of this application. The apparatus 2600 may be the sending device in the embodiment shown in FIG. 7 or a circuit system of the sending device, and is configured to implement the method corresponding to the sending device in the foregoing method embodiments. For a specific function, refer to the description in the method embodiments. For example, a circuit system is a chip system.

The apparatus 2600 includes at least one processor 2601, a communication line 2602, and at least one communication interface 2604. In an optional implementation, the apparatus 2600 may further include a memory 2603. The memory 2603 is not a necessarily included functional module, but is only an optional functional module, and therefore is indicated by a dashed-line box in FIG. 26.

The processor 2601 may include a general-purpose central processing unit (CPU), a microprocessor, an application-specific integrated circuit (ASIC), or one or more integrated circuits for controlling program execution for the solutions of this application.

The communication line 2602 may include a path on which information is transferred between the foregoing components.

The communication interface 2604 is configured to communicate with another device or a communication network like an ethernet, a radio access network (RAN), a wireless local area network (WLAN), or a wired access network by using any apparatus such as a transceiver.

The memory 2603 may be a read-only memory (ROM) or another type of static storage device that can store static information and instructions, or a random access memory (RAM) or another type of dynamic storage device that can store information and instructions; or may be an electrically erasable programmable read-only memory (EEPROM), a compact disc read-only memory (CD-ROM) or another optical disc storage, an optical disc storage (including a compact optical disc, a laser disc, an optical disc, a digital versatile disc, a Blu-ray disc, or the like), a magnetic disk storage medium or another magnetic storage device, or any other medium that can be configured to carry or store expected program code in a form of instructions or a data structure and that can be accessed by a computer, but is not limited thereto. The memory 2603 may exist independently, and is connected to the processor 2601 through the communication line 2602. Alternatively, the memory 2603 and the processor 2601 may be integrated together.

The memory 2603 is configured to store computer-executable instructions for performing the solutions in this application, and the processor 2601 controls execution. The processor 2601 is configured to execute the computer-executable instructions stored in the memory 2603, to implement the communication method provided in the foregoing embodiments of this application.

Optionally, the computer-executable instructions in this embodiment of this application may also be referred to as application program code. This is not specifically limited in this embodiment of this application.

During specific implementation, in an embodiment, the processor 2601 may include one or more CPUs, for example, a CPU 0 and a CPU 1 in FIG. 26.

In specific implementation, in an embodiment, the communication apparatus 2600 may include a plurality of processors, for example, the processor 2601 and a processor 2608 in FIG. 26. Each of the processors may be a single-core (single-CPU) processor or a multi-core (multi-CPU) processor. The processor may be one or more devices, circuits, and/or processing cores configured to process data (for example, computer program instructions).

When the apparatus 2600 shown in FIG. 26 is a chip, for example, a chip of an access network device, a chip of a UPF, a chip of an SMF, or a chip of a terminal device, the chip includes the processor 2601 (and may further include the processor 2608), the communication line 2602, the memory 2603, and the communication interface 2604. Specifically, the communication interface 2604 may be an input interface, a pin, a circuit, or the like. The memory 2603 may be a register, a buffer, or the like. The processor 2601 and the processor 2608 each may be a general-purpose CPU, a microprocessor, an ASIC, or one or more integrated circuits for controlling program execution for the communication method in any one of the foregoing embodiments.

The processor 2601 may be configured to generate a first signal (for example, the processor 2601 may execute computer execution instructions stored in the memory 2603 to generate the first signal), where duration of a first rising edge of the first signal is less than duration of a first falling edge, the duration of the first rising edge is duration of a rising edge of a main lobe waveform of the first signal, and the duration of the first falling edge is duration of a falling edge of the main lobe waveform of the first signal. The processor 2601 transfers the first signal to the communication interface 2604 through the communication line 2602, and the communication interface 2604 may be configured to send the first signal.

In an optional implementation, the first rising edge is determined based on a rising edge of a main lobe waveform of a second signal, the first falling edge is determined based on a falling edge of a main lobe waveform of a third signal, and the main lobe waveform of the second signal and the main lobe waveform of the third signal are different.

In an optional implementation, that the main lobe waveform of the second signal and the main lobe waveform of the third signal are different includes: Pulse duration of the main lobe waveform of the second signal and pulse duration of the main lobe waveform of the third signal are different.

In an optional implementation, both the second signal and the third signal are Gaussian pulse signals; both the second signal and the third signal are root raised cosine RRC pulse signals; both the second signal and the third signal are triangular pulse signals; the second signal is a Gaussian pulse signal, and the third signal is an RRC pulse signal; the second signal is an RRC pulse signal, and the third signal is a Gaussian pulse signal; the second signal is a Gaussian pulse signal, and the third signal is a triangular pulse signal; the second signal is a triangular pulse signal, and the third signal is a Gaussian pulse signal; the second signal is a triangular pulse signal, and the third signal is an RRC pulse signal; or the second signal is an RRC pulse signal, and the third signal is a triangular pulse signal.

In an optional implementation, a ratio of the duration of the first rising edge to the duration of the first falling edge is greater than or equal to a first threshold, and the first threshold is determined based on a power spectrum density constraint condition.

In an optional implementation, both the second signal and the third signal are Gaussian pulse signals, and the first threshold is $\frac{1}{2}$; or the second signal is a Gaussian pulse signal, the third signal is an RRC pulse signal, and the first threshold is $\frac{2}{3}$; or the second signal is a Gaussian pulse signal, the third signal is a triangular pulse signal, and the first threshold is $\frac{5}{12}$; or the second signal is a triangular pulse signal, the third signal is a Gaussian pulse signal, and the first threshold is $\frac{5}{9}$; the second signal is a triangular pulse signal, the third signal is an RRC pulse signal, and the first threshold is $\frac{5}{7}$; or both the second signal and the third signal are triangular pulse signals, and the first threshold is $\frac{1}{2}$.

In an optional implementation, if a ranging process is completed by the sending device, the sending device may first send a signal to the receiving device, and then receive a first signal from the receiving device. In this case, the signal sent by the sending device may be generated by the processor 2601. The processor 2601 generates the signal by invoking, for example, computer executable instructions stored in the memory 2603. After generating the signal, the processor 2601 transfers the signal to the communication interface 2604 through the communication line 2602, and the communication interface 2604 sends the signal. The communication interface 2604 is responsible for receiving the first signal from the receiving device. For example, after receiving the first signal, the communication interface 2604 may transfer the first signal to the processor 2601 through the communication line 2602, so that the processor 2601 may process the first signal. For example, the processor 2601 invokes computer execution instructions stored in the memory 2603 to process the first signal, to complete a process like ranging.

Figure 27:
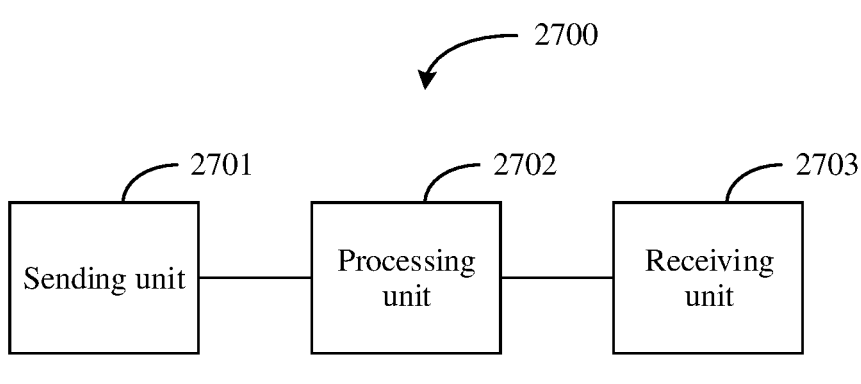
FIG. 27 is a schematic diagram of another apparatus according to an embodiment of this application.

In embodiments of this application, the apparatus may be divided into functional modules based on the foregoing method examples. For example, each functional module may be obtained through division based on each corresponding function, or two or more functions may be integrated into one processing module. The integrated module may be implemented in a form of hardware, or may be implemented in a form of a software functional module. It should be noted that, in embodiments of this application, module division is an example, and is merely a logical function division. In actual implementation, another division manner may be used. For example, when each functional module is obtained through division based on each corresponding function, FIG. 27 shows an apparatus. The apparatus 2700 may be the sending device in the foregoing method embodiments, or may be a chip in the sending device. The apparatus 2700 includes a sending unit 2701, a processing unit 2702, and a receiving unit 2703.

Optionally, functions/implementation processes of the sending unit 2701, the receiving unit 2703, and the processing unit 2702 in FIG. 27 may be implemented by the processor 2601 in FIG. 26 by invoking the computer executable instructions stored in the memory 2603.

Alternatively, a function/implementation process of the processing unit 2702 in FIG. 27 may be implemented by the processor 2601 in FIG. 26 by invoking the computer executable instructions stored in the memory 2603. Functions/implementation processes of the sending unit 2701 and the receiving unit 2703 in FIG. 27 may be implemented by the communication interface 2604 in FIG. 26.

Optionally, when the apparatus 2700 is a chip or a circuit, functions/implementation processes of the sending unit 2701 and the receiving unit 2703 may alternatively be implemented by using a pin, a circuit, or the like.

For example, the processing unit 2702 may be configured to generate a first signal, where duration of a first rising edge of the first signal is less than duration of a first falling edge, the duration of the first rising edge is duration of a rising edge of a main lobe waveform of the first signal, and the duration of the first falling edge is duration of a falling edge of the main lobe waveform of the first signal; and the sending unit 2701 may be configured to send the first signal.

It should be understood that the apparatus 2700 may be configured to implement steps performed by the sending device in the method in embodiments of this application. For related features, refer to the foregoing embodiments. Details are not described herein again.

All or some of the foregoing embodiments may be implemented by using software, hardware, firmware, or any combination thereof. When software is used to implement the embodiments, all or some of the embodiments may be implemented in a form of a computer program product. The computer program product includes one or more computer instructions. When the computer program instructions are loaded and executed on the computer, the procedure or functions according to embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave, or the like) manner. The computer-readable storage medium may be any usable medium accessible by the computer, or a data storage device, for example, a server or a data center, integrating one or more usable media. The available medium may be a magnetic medium (for example, a floppy disk, a hard disk, or a magnetic tape), an optical medium (for example, a DVD), a semiconductor medium (for example, a solid state disk (SSD)), or the like.

Various illustrative logic units and circuits described in embodiments of this application may implement or operate the described functions by using a general-purpose processor, a digital signal processor (DSP), an application-specific integrated circuit (ASIC), a field-programmable gate array (FPGA) or another programmable logic apparatus, a discrete gate or transistor logic, a discrete hardware component, or any combination thereof. The general-purpose processor may be a microprocessor. Optionally, the general-purpose processor may also be any conventional processor, controller, microcontroller, or state machine. The processor may also be implemented by a combination of computing apparatuses, such as a digital signal processor and a microprocessor, a plurality of microprocessors, one or more microprocessors with a digital signal processor core, or any other similar configuration.

Steps of the methods or algorithms described in embodiments of this application may be directly embedded into hardware, a software unit executed by a processor, or a combination thereof. The software unit may be stored in a RAM memory, a flash memory, a ROM memory, an EPROM memory, an EEPROM memory, a register, a hard disk, a removable magnetic disk, a CD-ROM, or a storage medium of any other form in the art. For example, the storage medium may connect to a processor so that the processor may read information from the storage medium and write information to the storage medium. Alternatively, the storage medium may be integrated into a processor. The processor and the storage media may be disposed in an ASIC, and the ASIC may be disposed in a terminal device. Optionally, the processor and the storage media may alternatively be disposed in different components in the terminal device.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although embodiments of this application are described with reference to specific features and embodiments thereof, it is clear that various modifications and combinations may be made to embodiments of this application without departing from the scope of embodiments of this application. Correspondingly, embodiments of this application and the accompanying drawings are merely example descriptions of embodiments of this application that are defined by the appended claims, and are considered to cover any or all of modifications, variations, combinations, or equivalents in the scope of embodiments of this application. It is clear that a person skilled in the art can make various modifications and variations to embodiments of this application without departing from the scope of embodiments of this application. Therefore, provided that the modifications and variations in embodiments of this application fall within the scope of the claims of this application and their equivalent technologies, embodiments of this application are also intended to include the modifications and variations.

What is claimed is:

1. A positioning signal sending method, comprising:
generating a first signal, wherein a duration of a first rising edge of the first signal is less than a duration of a first falling edge, the duration of the first rising edge is a duration of a rising edge of a main lobe waveform of the first signal, and the duration of the first falling edge is a duration of a falling edge of the main lobe waveform of the first signal; and
sending the first signal,
wherein the first rising edge is based on a rising edge of a main lobe waveform of a second signal, and the first falling edge is based on a falling edge of a main lobe waveform of a third signal,
wherein a ratio of the duration of the first rising edge to the duration of the first falling edge is greater than or equal to a first threshold, and the method further comprises determining the first threshold based on a power spectrum density constraint condition, and wherein:
both the second signal and the third signal are Gaussian pulse signals, and the first threshold is ½;

the second signal is a Gaussian pulse signal, the third signal is an RRC pulse signal, and the first threshold is ⅔;
the second signal is a Gaussian pulse signal, the third signal is a triangular pulse signal, and the first threshold is 5/12;
the second signal is a triangular pulse signal, the third signal is a Gaussian pulse signal, and the first threshold is 5/9;
the second signal is a triangular pulse signal, the third signal is an RRC pulse signal, and the first threshold is 5/7; or
both the second signal and the third signal are triangular pulse signals, and the first threshold is ½.

2. The method of claim 1, further comprising:
determining the first rising edge based on the rising edge of the main lobe waveform of the second signal, and determining the first falling edge based on the falling edge of the main lobe waveform of the third signal, and the main lobe waveform of the second signal and the main lobe waveform of the third signal are different.

3. The method of claim 2, wherein that the main lobe waveform of the second signal and the main lobe waveform of the third signal are different comprises:
a pulse duration of the main lobe waveform of the second signal and a pulse duration of the main lobe waveform of the third signal are different.

4. The method of claim 2, wherein
both the second signal and the third signal are Gaussian pulse signals;
both the second signal and the third signal are root raised cosine (RRC) pulse signals;
both the second signal and the third signal are triangular pulse signals;
the second signal is a Gaussian pulse signal, and the third signal is an RRC pulse signal;
the second signal is an RRC pulse signal, and the third signal is a Gaussian pulse signal;
the second signal is a Gaussian pulse signal, and the third signal is a triangular pulse signal;
the second signal is a triangular pulse signal, and the third signal is a Gaussian pulse signal;
the second signal is a triangular pulse signal, and the third signal is an RRC pulse signal; or
the second signal is an RRC pulse signal, and the third signal is a triangular pulse signal.

5. The method of claim 2, wherein before the sending the first signal, the method further comprises:
sending first indication information, wherein the first indication information comprises one or more of the following:
shape information of the first signal;
shape information of the second signal and shape information of the third signal;
the duration of the first rising edge;
the duration of the first falling edge; or
a timestamp of the first signal.

6. A positioning signal sending apparatus, comprising a processor and a transceiver, wherein the apparatus is configured to:
generate a first signal, wherein a duration of a first rising edge of the first signal is less than a duration of a first falling edge, the duration of the first rising edge is a duration of a rising edge of a main lobe waveform of the first signal, and the duration of the first falling edge is a duration of a falling edge of the main lobe waveform of the first signal; and send the first signal, wherein the first rising edge is based on a rising edge of a main lobe waveform of a second signal, and the first falling edge is based on a falling edge of a main lobe waveform of a third signal, wherein a ratio of the duration of the first rising edge to the duration of the first falling edge is greater than or equal to a first threshold, and the method further comprises determining the first threshold based on a power spectrum density constraint condition, and wherein:

both the second signal and the third signal are Gaussian pulse signals, and the first threshold is ½;

the second signal is a Gaussian pulse signal, the third signal is an RRC pulse signal, and the first threshold is ⅔;

the second signal is a Gaussian pulse signal, the third signal is a triangular pulse signal, and the first threshold is 5/12;

the second signal is a triangular pulse signal, the third signal is a Gaussian pulse signal, and the first threshold is 5/9;

the second signal is a triangular pulse signal, the third signal is an RRC pulse signal, and the first threshold is 5/7; or both the second signal and the third signal are triangular pulse signals, and the first threshold is ½.

7. The apparatus of claim 6, wherein the apparatus is further configured to:

determine the first rising edge based on the rising edge of the main lobe waveform of the second signal, and determining the first falling edge based on the falling edge of the main lobe waveform of the third signal, and the main lobe waveform of the second signal and the main lobe waveform of the third signal are different.

8. The apparatus of claim 7, wherein that the main lobe waveform of the second signal and the main lobe waveform of the third signal are different comprises:

a pulse duration of the main lobe waveform of the second signal and a pulse duration of the main lobe waveform of the third signal are different.

9. The apparatus of claim 7, wherein both the second signal and the third signal are Gaussian pulse signals;

both the second signal and the third signal are root raised cosine (RRC) pulse signals;

both the second signal and the third signal are triangular pulse signals;

the second signal is a Gaussian pulse signal, and the third signal is an RRC pulse signal;

the second signal is an RRC pulse signal, and the third signal is a Gaussian pulse signal;

the second signal is a Gaussian pulse signal, and the third signal is a triangular pulse signal;

the second signal is a triangular pulse signal, and the third signal is a Gaussian pulse signal;

the second signal is a triangular pulse signal, and the third signal is an RRC pulse signal; or the second signal is an RRC pulse signal, and the third signal is a triangular pulse signal.

10. The apparatus of claim 6, wherein the transceiver is further configured to send first indication information before sending the first signal, wherein the first indication information comprises one or more of the following:

shape information of the first signal;

shape information of the second signal and shape information of the third signal;

the duration of the first rising edge;

the duration of the first falling edge; or a timestamp of the first signal.

11. A non-transitory computer-readable storage medium, wherein the computer-readable storage medium stores a computer program, and when the computer program is run, the computer is enabled to perform the following steps:

generating a first signal, wherein a duration of a first rising edge of the first signal is less than a duration of a first falling edge, the duration of the first rising edge is a duration of a rising edge of a main lobe waveform of the first signal, and the duration of the first falling edge is a duration of a falling edge of the main lobe waveform of the first signal; and sending the first signal, wherein the first rising edge is based on a rising edge of a main lobe waveform of a second signal, and the first falling edge is based on a falling edge of a main lobe waveform of a third signal, wherein a ratio of the duration of the first rising edge to the duration of the first falling edge is greater than or equal to a first threshold, and the method further comprises determining the first threshold based on a power spectrum density constraint condition, and wherein:

both the second signal and the third signal are Gaussian pulse signals, and the first threshold is ½;

the second signal is a Gaussian pulse signal, the third signal is an RRC pulse signal, and the first threshold is ⅔;

the second signal is a Gaussian pulse signal, the third signal is a triangular pulse signal, and the first threshold is 5/12;

the second signal is a triangular pulse signal, the third signal is a Gaussian pulse signal, and the first threshold is 5/9;

the second signal is a triangular pulse signal, the third signal is an RRC pulse signal, and the first threshold is 5/7; or both the second signal and the third signal are triangular pulse signals, and the first threshold is ½.

12. The medium of claim 11, wherein when the computer program is run, the computer is further enabled to perform the following:

determine the first rising edge based on the rising edge of the main lobe waveform of the second signal, and determining the first falling edge based on the falling edge of the main lobe waveform of the third signal, and the main lobe waveform of the second signal and the main lobe waveform of the third signal are different.

13. The medium of claim 12, wherein that the main lobe waveform of the second signal and the main lobe waveform of the third signal are different comprises:

a pulse duration of the main lobe waveform of the second signal and a pulse duration of the main lobe waveform of the third signal are different.

14. The medium of claim 11, wherein both the second signal and the third signal are Gaussian pulse signals;

both the second signal and the third signal are root raised cosine (RRC) pulse signals;

both the second signal and the third signal are triangular pulse signals;

the second signal is a Gaussian pulse signal, and the third signal is an RRC pulse signal;

the second signal is an RRC pulse signal, and the third signal is a Gaussian pulse signal;

the second signal is a Gaussian pulse signal, and the third signal is a triangular pulse signal;

the second signal is a triangular pulse signal, and the third signal is a Gaussian pulse signal;

the second signal is a triangular pulse signal, and the third signal is an RRC pulse signal; or the second signal is an RRC pulse signal, and the third signal is a triangular pulse signal.

15. The medium of claim 11, wherein when the computer program is run, the computer is further enabled to send first indication information before sending the first signal, wherein the first indication information comprises one or more of the following:

shape information of the first signal;

shape information of the second signal and shape information of the third signal;

the duration of the first rising edge;

the duration of the first falling edge; or a timestamp of the first signal.

16. A non-transitory computer-readable medium comprising computer-executable instructions that are stored on a non-transitory computer-readable storage medium and that, when executed, cause an apparatus to:

generate a first signal, wherein a duration of a first rising edge of the first signal is less than a duration of a first falling edge, the duration of the first rising edge is a duration of a rising edge of a main lobe waveform of the first signal, and the duration of the first falling edge is a duration of a falling edge of the main lobe waveform of the first signal; and send the first signal, wherein the first rising edge is based on a rising edge of a main lobe waveform of a second signal, and the first falling edge is based on a falling edge of a main lobe waveform of a third signal, wherein a ratio of the duration of the first rising edge to the duration of the first falling edge is greater than or equal to a first threshold, and the method further comprises determining the first threshold based on a power spectrum density constraint condition, and wherein:

both the second signal and the third signal are Gaussian pulse signals, and the first threshold is ½;

the second signal is a Gaussian pulse signal, the third signal is an RRC pulse signal, and the first threshold is ⅔;

the second signal is a Gaussian pulse signal, the third signal is a triangular pulse signal, and the first threshold is 5/12;

the second signal is a triangular pulse signal, the third signal is a Gaussian pulse signal, and the first threshold is 5/9;

the second signal is a triangular pulse signal, the third signal is an RRC pulse signal, and the first threshold is 5/7; or both the second signal and the third signal are triangular pulse signals, and the first threshold is ½.

17. The non-transitory computer-readable medium of claim 16, wherein when executed, the instructions further cause the apparatus to:

determine the first rising edge based on the rising edge of the main lobe waveform of the second signal, and determining the first falling edge based on the falling edge of the main lobe waveform of the third signal, and the main lobe waveform of the second signal and the main lobe waveform of the third signal are different.

18. The non-transitory computer-readable medium computer program product of claim 17, wherein the main lobe waveform of the second signal and the main lobe waveform of the third signal are different comprises:

a pulse duration of the main lobe waveform of the second signal and a pulse duration of the main lobe waveform of the third signal are different.

19. The medium of claim 16, wherein both the second signal and the third signal are Gaussian pulse signals;

both the second signal and the third signal are root raised cosine (RRC) pulse signals;

both the second signal and the third signal are triangular pulse signals;

the second signal is a Gaussian pulse signal, and the third signal is an RRC pulse signal;

the second signal is an RRC pulse signal, and the third signal is a Gaussian pulse signal;

the second signal is a Gaussian pulse signal, and the third signal is a triangular pulse signal;

the second signal is a triangular pulse signal, and the third signal is a Gaussian pulse signal;

the second signal is a triangular pulse signal, and the third signal is an RRC pulse signal; or the second signal is an RRC pulse signal, and the third signal is a triangular pulse signal.

20. The medium of claim 16, wherein when executed, the instructions further cause the apparatus to send first indication information before sending the first signal, wherein the first indication information comprises one or more of the following:

shape information of the first signal;

shape information of the second signal and shape information of the third signal;

the duration of the first rising edge;

the duration of the first falling edge; or a timestamp of the first signal.

* * * * *